US010290992B2

(12) United States Patent
Umeda et al.

(10) Patent No.: US 10,290,992 B2
(45) Date of Patent: May 14, 2019

(54) LASER SYSTEM

(71) Applicant: Gigaphoton Inc., Tochigi (JP)

(72) Inventors: Hiroshi Umeda, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/895,634

(22) Filed: Feb. 13, 2018

(65) Prior Publication Data

US 2018/0191124 A1    Jul. 5, 2018

Related U.S. Application Data

(63) Continuation of application No. PCT/JP2015/076010, filed on Sep. 14, 2015.

(51) Int. Cl.
| H01S 3/097 | (2006.01) |
| H01S 3/104 | (2006.01) |
| H01S 3/225 | (2006.01) |
| H01L 21/20 | (2006.01) |
| H01S 3/23 | (2006.01) |

(52) U.S. Cl.
CPC ...... *H01S 3/09702* (2013.01); *H01L 21/2026* (2013.01); *H01S 3/104* (2013.01); *H01S 3/225* (2013.01); *H01S 3/2383* (2013.01)

(58) Field of Classification Search
CPC ...... H01S 3/09702; H01S 3/225; H01S 3/104; H01S 3/2383; H01L 21/2026
See application file for complete search history.

(56) References Cited

U.S. PATENT DOCUMENTS

| 6,985,508 | B2 * | 1/2006 | Knowles ............. G03F 7/70025 |
|           |      |        | 372/25 |
| 8,238,400 | B2 | 8/2012 | Targsdorf et al. |
| 2003/0099269 | A1 | 5/2003 | Ershov et al. |
| 2005/0031004 | A1 | 2/2005 | Basting et al. |
| 2012/0033689 | A1 | 2/2012 | Targsdorf et al. |
| 2016/0248214 | A1 * | 8/2016 | Kurosu ............... H01S 3/09702 |

FOREIGN PATENT DOCUMENTS

| JP | 2004-342964 A | 12/2004 |
| JP | 2005-512333 A | 4/2005 |
| JP | 2009-99727 A | 5/2009 |
| JP | 2013-533642 A | 8/2013 |

OTHER PUBLICATIONS

Notification of Transmittal of Translation of the International Preliminary Report on Patentability (Chapter I) and Translation of Written Opinion of the International Searching Authority; PCT/JP2015/076010; dated Mar. 20, 2018.

International Search Report issued in PCT/JP2015/076010; dated Dec. 1, 2015.

* cited by examiner

Primary Examiner — Dung T Nguyen
(74) Attorney, Agent, or Firm — Studebaker & Brackett PC

(57) ABSTRACT

The laser system includes a first laser apparatus, a second laser apparatus, a charging voltage measuring unit configured to measure the charging voltage of the first storage capacitor and the charging voltage of the second storage capacitor, at least one bleeding circuit configured to reduce the charging voltage of the first storage capacitor and the charging voltage of the second storage capacitor, and a bleeding circuit controller configured to control the at least one bleeding circuit based on the voltage measured by the charging voltage measuring unit.

11 Claims, 18 Drawing Sheets

LASER SYSTEM

TECHNICAL FIELD

The present disclosure relates to a laser system.

BACKGROUND ART

A laser annealing apparatus may apply a pulse laser beam on an amorphous silicon film formed on a substrate. The pulse laser beam may be emitted from a laser system such as an excimer laser system. The pulse laser beam may have a wavelength of an ultraviolet light region. Such pulse laser beam may reform the amorphous silicon film to a poly-silicon film. The poly-silicon film can be used to form thin film transistors (TFTs). The TFTs may be used in large-sized liquid crystal displays.

Patent Document 1: Japanese Patent Application Publication No. 2004-342964 A
Patent Document 2: U.S. Pat. No. 8238400 B
Patent Document 3: U.S. Pat. No. 6865210 B

SUMMARY

An aspect of the present disclosure may be a laser system comprising: a first laser apparatus including a first laser chamber, a first pair of electrodes provided in the first laser chamber, a first pulse generator including a first storage capacitor, the first pulse generator being configured to generate a pulsed voltage using electric energy stored in the first storage capacitor and configured to apply the pulsed voltage to the first pair of electrodes, and a first charger configured to supply electric energy to charge the first storage capacitor; a second laser apparatus including a second laser chamber, a second pair of electrodes provided in the second laser chamber, a second pulse generator including a second storage capacitor, the second pulse generator being configured to generate a pulsed voltage using electric energy stored in the second storage capacitor and configured to apply the pulsed voltage to the second pair of electrodes, and a second charger configured to supply electric energy to charge the second storage capacitor; a charging voltage measuring unit configured to measure the charging voltage of the first storage capacitor and the charging voltage of the second storage capacitor; at least one bleeding circuit configured to reduce the charging voltage of the first storage capacitor and the charging voltage of the second storage capacitor; and a bleeding circuit controller configured to control the at least one bleeding circuit based on the voltage measured by the charging voltage measuring unit.

Another aspect of the present disclosure may be a laser system comprising: a first laser apparatus including a first laser chamber, a first pair of electrodes provided in the first laser chamber, a first pulse generator including a first storage capacitor, the first pulse generator being configured to generate a pulsed voltage using electric energy stored in the first storage capacitor and configured to apply the pulsed voltage to the first pair of electrodes, and a first charger configured to supply electric energy to charge the first storage capacitor; a second laser apparatus including a second laser chamber, a second pair of electrodes provided in the second laser chamber, a second pulse generator including a second storage capacitor, the second pulse generator being configured to generate a pulsed voltage using electric energy stored in the second storage capacitor and configured to apply the pulsed voltage to the second pair of electrodes, and a second charger configured to supply electric energy to charge the second storage capacitor; a charging voltage measuring unit configured to measure the charging voltage of the first storage capacitor and the charging voltage of the second storage capacitor; and a synchronizing control unit configured to control timing of the pulsed voltage applied by the first pulse generator to the first pair of electrodes, the timing being controlled based on the charging voltage of the first storage capacitor, and timing of the pulsed voltage applied by the second pulse generator to the second pair of electrodes, the timing being controlled based on the charging voltage of the second storage capacitor.

BRIEF DESCRIPTION OF DRAWINGS

Embodiments of the present disclosure will be described below as mere examples with reference to the appended drawings.

DESCRIPTION OF EMBODIMENTS

Contents

1. Laser Apparatus of Comparative Example
   1.1 Outline of Laser Apparatus
   1.2 Beam Bundling Device
   1.3 Exposure Apparatus
   1.4 Controller
   1.5 Details of Laser Apparatus
   1.6 Operation of Laser Apparatus
   1.7 Timing Chart
   1.8 Flowchart
      1.8.1 Process of Laser System Controller
      1.8.2 Process of Laser Controller
      1.8.3 Process of nth Trigger Correction Unit
   1.9 Problem
2. Laser System That Controls Bleeding Circuit Based on Measured Charging Voltage (First Embodiment)
   2.1 Configuration
   2.2 Operation
      2.2.1 Process of Measurement Control Unit
      2.2.2 Process of Bleeding Circuit Controller
   2.3 Effect
3. Laser System That Controls Trigger Timing Based on Measured Charging Voltage (Second Embodiment)
   3.1 Configuration
   3.2 Operation
4. Laser System Where Trigger Correction Unit and Laser Apparatus are Integrated (Third Embodiment)
5. Laser System That Controls Both Bleeding Circuit and Trigger Timing Based on Measured Charging Voltage (Fourth Embodiment)
   5.1 Configuration
   5.2 Operation
6. Laser Apparatuses That Share Bleeding Circuit (Fifth Embodiment)
   6.1 Configuration
   6.2 Operation
7. Laser System Including Three or More Laser Apparatuses (Sixth Embodiment)
8. Configuration of Controller Embodiments of the present disclosure will be described in detail below with reference to the drawings. The embodiments described below may indicate several examples of the present disclosure and may not intend to limit the content of the present disclosure. Not all of the configurations and operations described in the embodiments are indispensable in the present disclosure. Identical reference symbols may be assigned to identical constituent elements and redundant descriptions thereof may be omitted.

1. Laser Apparatus of Comparative Example

Figure 1:
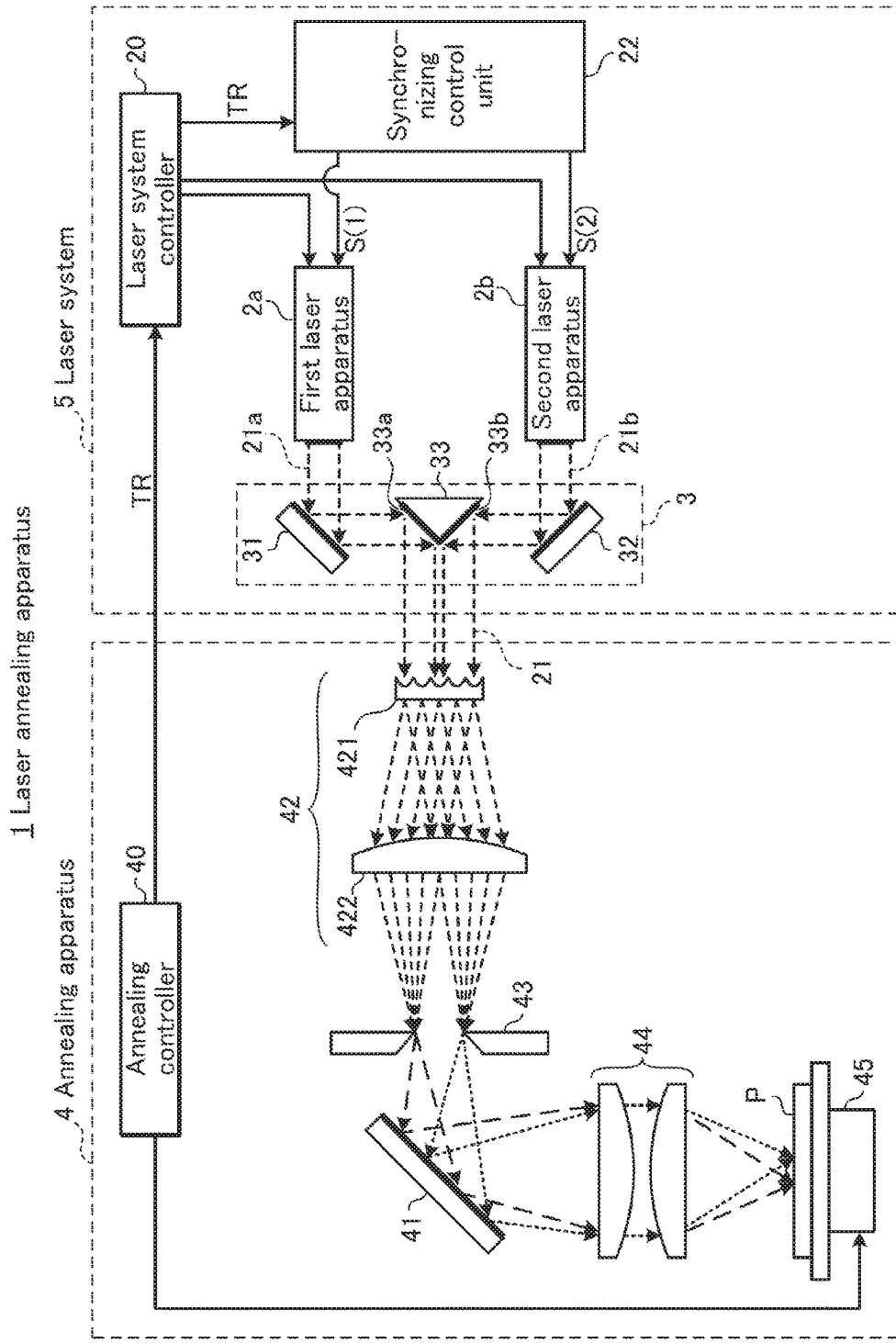
FIG. 1 schematically shows a configuration of a laser annealing apparatus including a laser system according to a comparative example.

FIG. 1 schematically shows a configuration of annealing apparatus 1 including a laser system according to a comparative example. The laser annealing apparatus 1 shown in FIG. 1 may include a laser system 5 and an annealing apparatus 4. The laser system 5 may include a laser system controller 20, a synchronizing control unit 22, first and second laser apparatuses 2a and 2b, and a beam bundling device 3.

1.1 Outline of Laser Apparatus

Each of the first and second laser apparatuses 2a and 2b may be, for example, an excimer laser apparatus using XeF, XeCl, KrF, or ArF as a laser medium. The first and second laser apparatuses 2a and 2b may have substantially the same configurations with each other. The first and second laser apparatuses 2a and 2b may output first and second pulse laser beams 21a and 21b, respectively. Wavelengths of the first and second pulse laser beams 21a and 21b may each be in an ultraviolet light region.

The first and second pulse laser beams 21a and 21b may be directed to the beam bundling device 3. FIG. 1 shows the two laser apparatuses. However, the number of laser apparatuses is not limited to two. The number of laser apparatuses may be three or more as described below with reference to FIG. 17.

1.2 Beam Bundling Device

The beam bundling device 3 may include high-reflective mirrors 31 and 32 and a right-triangle prism 33. The right-triangle prism 33 may be provided between the high-reflective mirrors 31 and 32. The high-reflective mirror 31 may be provided at an angle of approximately 45° with an optical path axis of the first pulse laser beam 21a. The high-reflective mirror 32 may be provided at an angle of approximately 45° with an optical path axis of the second pulse laser beam 21b.

The right-triangle prism 33 may have a triangular prism shape in which a bottom face parallel to the paper surface of this figure is a right triangle. In the right-triangle prism 33, two side faces contacting at a right angle may each be coated with a high-reflective film. The respective two side faces contacting at the right angle may constitute a first reflective surface 33a and a second reflective surface 33b.

The first pulse laser beam 21a outputted from the first laser apparatus 2a may be reflected by the high-reflective mirror 31 to the first reflective surface 33a of the right-triangle prism 33. The first pulse laser beam 21a may further be reflected by the first reflective surface 33a of the right-triangle prism 33 to be outputted to the annealing apparatus 4.

The second pulse laser beam 21b outputted from the second laser apparatus 2b may be reflected by the high-reflective mirror 32 to the second reflective surface 33b of the right-triangle prism 33. The second pulse laser beam 21b may further be reflected by the second reflective surface 33b of the right-triangle prism 33 to be outputted to the annealing apparatus 4.

The beam bundling device 3 may thus cause the optical path axes of the first and second pulse laser beams 21a and 21b to be parallel to each other and cause the optical paths to be close to each other to emit a bundled laser beam 21. An "optical path axis" of a pulse laser beam in this specification may mean the central axis of the optical path of the pulse laser beam. A "bundled laser beam" may be a beam where pulse laser beams are bundled with each other. The bundled laser beam 21 may have pulse energy approximately two times as high as a pulse laser beam outputted from a single laser apparatus.

1.3 Exposure Apparatus

The annealing apparatus 4 may include an annealing controller 40, an illumination optical system 42, a mask 43, a high-reflective mirror 41, a transfer optical system 44, and a stage 45. The annealing apparatus 4 may cause the bundled laser beam 21 emitted from the laser system 5 to have a predetermined mask pattern and may transfer the mask pattern on a workpiece P.

The illumination optical system 42 may include a fly-eye lens 421 and a condenser optical system 422 to constitute a Koehler illumination.

The fly-eye lens 421 may be provided in the optical path of the bundled laser beam 21 emitted from the laser system 5. The fly-eye lens 421 may include multiple lenses arrayed in a beam cross-section of the bundled laser beam 1. The bundled laser beam 21 incident on the fly-eye lens 421 may include substantially parallel rays of light. The lenses included in the fly-eye lens 421 may transmit the respective parts of the bundled laser beam 21 to the condenser optical systems 422. Here, each of the lenses may expand the beam width of the corresponding part of the bundled laser beam 21.

The condenser optical system 422 may be provided in the optical path of the bundled laser beam 21 emitted from the fly-eye lens 421. The condenser optical system 422 may illuminate the mask 43 with the bundled laser beam 21 emitted from the fly-eye lens 421.

The condenser optical system 422 may be provided such that a rear side focal plane of the condenser optical system 422 substantially coincides with the mask 43. The condenser optical system 422 may thus cause the parts of the bundled laser beam 21 transmitted by the respective lenses included in the fly-eye lens 421 to be incident on substantially the same region of the mask 43.

FIG. 1 shows the condenser optical system 422 including a single convex lens. However, the condenser optical system 422 may include a commination of the convex lens and an unillustrated convex lens or a combination of the convex lens and an unillustrated concave lens. The condenser optical system 422 may include a concave mirror.

The illumination optical system 42 may reduce, with the configuration described above, unevenness in light intensity distribution of a beam cross-section of the bundled laser beam 21 incident on the mask 43.

The mask 43 may be a slit plate having a rectangular shaped opening. The shape of the opening of the slit plate may constitute the mask pattern of the mask 43. The mask pattern of the mask 43 may not be limited to one having the rectangular shape and may have a desired shape.

The high-reflective mirror 41 may be provided in the optical path of the bundled laser beam 21 having passed through the mask 43. The high-reflective mirror 41 may reflect the bundled laser beam 21 to cause the bundled laser beam 21 to be incident on the transfer optical system 44.

The transfer optical system 44 may be provided in the optical path of the bundled laser beam 21 reflected by the high-reflective mirror 41. The transfer optical system 44 may be provided such that a position of an image of the mask 43 formed by the transfer optical system 44 substantially coincides with a position to be irradiated on the workpiece P. The transfer optical system 44 may thus transfer the mask pattern of the mask 43 on the workpiece P.

The transfer optical system 44 may include one or more convex lenses. The transfer optical system 44 is not, however, limited to one including one or more convex lenses. For example, the transfer optical system 44: may include a combination convex lens and a concave lens, or a concave mirror or the like. The transfer optical system 44 may be configured by a cylindrical lens that forms an image in a short-length direction of the rectangular shaped mask pattern on the workpiece P.

The stage 45 may be configured to move the workpiece P such that the image of the mask 43 formed by the transfer optical system 44 moves along the surface of the workpiece P to be irradiated.

Thus, the laser system 5 may output the bundled laser beam 21 having a higher value of pulse energy than the pulse laser beam outputted from a single laser apparatus. The laser annealing apparatus 1 may thus irradiate the workpiece P with the bundled laser beam 21 having a predetermined pulse energy density desirable for annealing, and an area to be irradiated may be large. Efficient manufacture of liquid crystal displays having a large area may thus be possible.

1.4 Controller

The annealing controller 40 may be configured to move the stage 45, exchange the workpiece P or the mask 43, etc. The annealing controller 40 may output a trigger signal TR to the laser system controller 20.

The laser system controller 20 may transfer the trigger signal TR received from the annealing controller 40 to the synchronizing control unit 22. The synchronizing control unit 22 may send, based on the trigger signal TR received from the laser system controller 20, first and second switching signals S(1) and S(2) to the first and second laser apparatuses 2a and 2b, respectively. The first and second laser apparatuses 2a and 2b may output the pulse laser beams based on the respective switching signals received from the synchronizing control unit 22.

1.5 Details of Laser Apparatus

Figure 2:
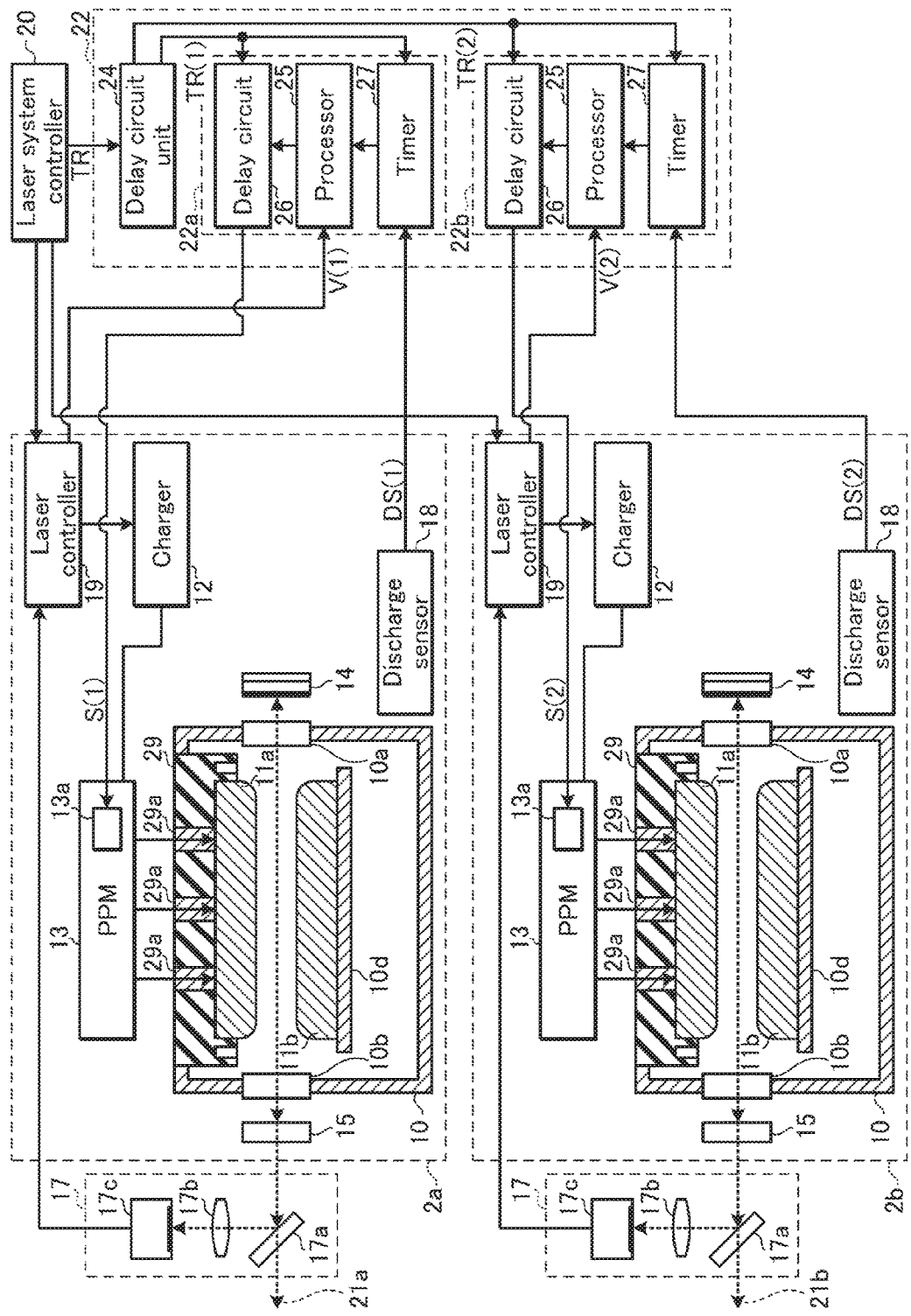
FIG. 2 shows an exemplary configuration of the laser system shown in FIG. 1.

FIG. 2 shows an exemplary configuration of the laser system shown in FIG. 1. The first laser apparatus 2a may include, for example, a laser chamber 10, a pair of electrodes 11a and 11b, a charger 12, and a pulse power module (PPM) 13. The first laser apparatus 2a may further include a high-reflective mirror 14, an output coupling mirror 15, a pulse energy measuring unit 17, a discharge sensor 18, and a laser controller 19. A configuration of the second laser apparatus 2b may be substantially the same as that of the first laser apparatus 2a. FIG. 2 shows an internal configuration of each laser chamber 10 as viewed in a direction perpendicular to both the traveling direction of the pulse laser beam 21a and a direction of electric discharge between the pair of electrodes 11a and 11b.

The laser chamber 10 may seal laser gas as the laser medium including, for example, a rare gas such as argon gas, krypton gas, or xenon gas, a buffer gas such as neon gas or helium gas, and a halogen gas such as chlorine gas or fluorine gas, etc. The pair of electrodes 11a and 11b may be provided a the laser chamber 10 as electrodes to excite the laser medium by electric discharge. The laser chamber 10 may have an opening that is sealed by an insulating member 29. The electrode 11a may be held by the insulating member 29 and the electrode 11b may be held by a return plate 10d. The return plate 10d may be connected to an interior surface of the laser chamber 10 by electric wires 10e and 10f described below with reference to FIG. 9. Conductive members 29a may be molded in the insulating member 29. The conductive members 29a may apply high voltage supplied by the pulse power module 13 to the electrode 11a.

The charger 12 may be a direct-current power source to charge a storage capacitor C0 described below an the pulse power module 13 at a predetermined voltage. The pulse power module 13 may include a switch 13a and a magnetic compression circuit described below. The pulse power module 13 may correspond to a pulse generator in the present disclosure.

Respective ends of the laser chamber 10 may have windows 10a and 10b. The high-reflective mirror 14 and the output coupling mirror 15 may configure an optical resonator. The pulse energy measuring unit 17 may include a beam splitter 17a, a focusing optical system 17b, and an optical sensor 17c.

The synchronizing control unit 22 may include first and second trigger correction units 22a and 22b and a delay circuit unit 24. The first and second trigger correction units 22a and 22b may each include a processor 25, a delay circuit 26, and a timer 27.

1.6 Operation of Laser Apparatus

In the synchronizing control unit an unillustrated clock signal generation unit may supply a common clock signal to the first and second trigger correction units 22a and 22b and the delay circuit unit 24. The delay circuit unit 24 may receive the trigger signal TR outputted from the laser system controller 20. The delay circuit unit 24 may output a first delay signal TR(1) showing that a first delay time TRd(1) has passed since the time of receiving the trigger signal TR to the delay circuit 26 and the time 27 both included in the first trigger correction unit 22a. The delay circuit unit 24 may output a second delay signal TR(2) showing that a second delay time TRd(2) has passed since the time of receiving the trigger signal TR to the delay circuit 26 and the timer 27 both included in the second trigger correction unit 22b. The data on the first delay time TRd(1) and the data on the second delay time TRd(2) may be supplied by the laser system controller 20 to the synchronizing control unit 22.

The delay circuit 26 of the first trigger correction unit 22a may output the first switching signal S(1) showing that a first correction time Td(1) has passed since the time of receiving the first delay signal TR(1) to the pulse power module 13 of the first laser apparatus 2a. The first correction time Td(1) may be set by the processor 25 of the first trigger correction unit 22a. The delay circuit 26 of the second trigger correction unit 22b may output the second switching signal S(2) showing that a second correction time Td(2) has passed since the time of receiving the second delay signal TR(2) to the pulse power module 13 of the second laser apparatus 2b. The second correction time Td(2) may be set by the processor 25 of the second trigger correction unit 22b.

The laser controller 19 may send and receive various signals to and from the laser system controller 20 described above. For example, the laser controller 19 may receive data on target pulse energy from laser system controller 20. The laser controllers 19 of the first and second laser apparatuses 2a and 2b may calculate setting values V(1) and V(2) of charging voltage, respectively, based on the data on target pulse energy Et(1) and target pulse energy Et(2) received from the laser system controller 20. In each of the first and second laser apparatuses 2a and 2b, the laser controller 19 may send the setting value of the charging voltage to the processor 25 of the corresponding trigger correction unit and to the charger 12. The charger 12 may charge the storage capacitor C0 of the pulse power module 13 according to the setting value of the charging voltage.

The pulse power modules 13 of the first and second laser apparatuses 2a and 2b may receive the first and second switching signals S(1) and S(2) outputted from the delay circuits 26, respectively. The switches 13a in the pulse power modules 13 of the first and second laser apparatuses 2a and 2b may turn ON according to the switching signals S(1) and S(2), respectively. When the switch 13a turns ON in each of the first and second laser apparatuses 2a and 2b, the pulse pager module 13 may generate a pulsed high voltage electric energy stored in the storage capacitor C0. The high voltage may be applied to the pair of electrodes 11a and 11b.

Applying the high voltage to the pair of electrodes 11a and 11b may cause an insulation breakdown between the pair of electrodes 11a and 11b, and an electric discharge may occur. The energy of the electric discharge may excite the laser medium in the laser chamber 10 to shift the laser medium to a high energy level. The excited laser medium may then be shifted back to a low energy level to emit light according to the difference in the energy levels.

The light generated in the laser chamber 10 may be emitted from the laser chamber 10 via the windows 10a and 10b. The high-reflective mirror 14 may reflect the light emitted via the window 10a of the laser chamber 10 at a high reflectance to return it to the laser chamber 10. The output coupling mirror 15 may transmit and output a part of the light outputted via the window 10b of the laser chamber 10, and reflect another part of the light to return it to the laser chamber 10.

The light emitted from laser chamber 10 may reciprocate between the high-reflective mirror 14 and the output coupling mirror 15 to be amplified every time it passes through a laser gain space between the electrodes 11a and 11b. A part of the light amplified in each of the first and second laser apparatuses 2a and 2b may be outputted via the output coupling mirror 15 as the pulse laser beam 21a or 21b.

The beam splitter 17a of the pulse energy measuring unit 17 may transmit a part of the pulse laser beam at a high transmittance and reflect another part of the pulse laser beam to the focusing optical system 17b. The focusing optical system 17b may concentrate the pulse laser beam reflected by the beam splitter 17a on a light receiving surface of the optical sensor 17c. The optical sensor 17c may detect the pulse energy of the pulse laser beam concentrated on the light receiving surface and may output data on the detected pulse energy to the laser controller 19. The laser controller 19 may perform feedback control of the setting value of the charging voltage based on data on the target pulse energy received from the laser system controller 20 and the data on the detected pulse energy.

Each of the discharge sensors 18 of the first and second laser apparatuses 2a and 2b may detect the electric discharge generated between the pair of electrodes 11a and 11b. The discharge sensors 18 may output first and second discharge detection signals DS(1) and DS(2), respectively. The first and second discharge detection signals DS(1) and DS(2) may be inputted to the timers 27 of the first and second trigger correction units 22a and 22b, respectively.

The timer 27 of the first trigger correction unit 22a may measure a first elapsed time TRdm(1) from the time of receiving the first delay signal TR(1) to the time of receiving the first discharge detection signal DS(1) and may send the first elapsed time TRdm(1) to the corresponding processor 25. The timer 27 of the second trigger correction unit 22b may measure a second delay elapsed time TRdm(2) from the time of receiving the second delay signal TR(2) to the time of receiving the second discharge detection signal DS(2) and may send the second elapsed time TRdm(2) to the corresponding processor 25.

The processor 25 of the first trigger correction unit 22a may set the first correction time Td(1) based on the setting value V(1) of the charging voltage sent from the laser controller 19 of the first laser apparatus 2a and on the first elapsed time TRdm(1) sent from the timer 27.

The processor 25 of the second trigger correction unit 22b may set the second correction time Td(2) based on the setting value V(2) of the charging voltage sent from the laser controller 19 of the second laser apparatus 2b and on the second elapsed time TRdm(2) sent from the timer 27.

1.7 Timing Chart

Figure 3:
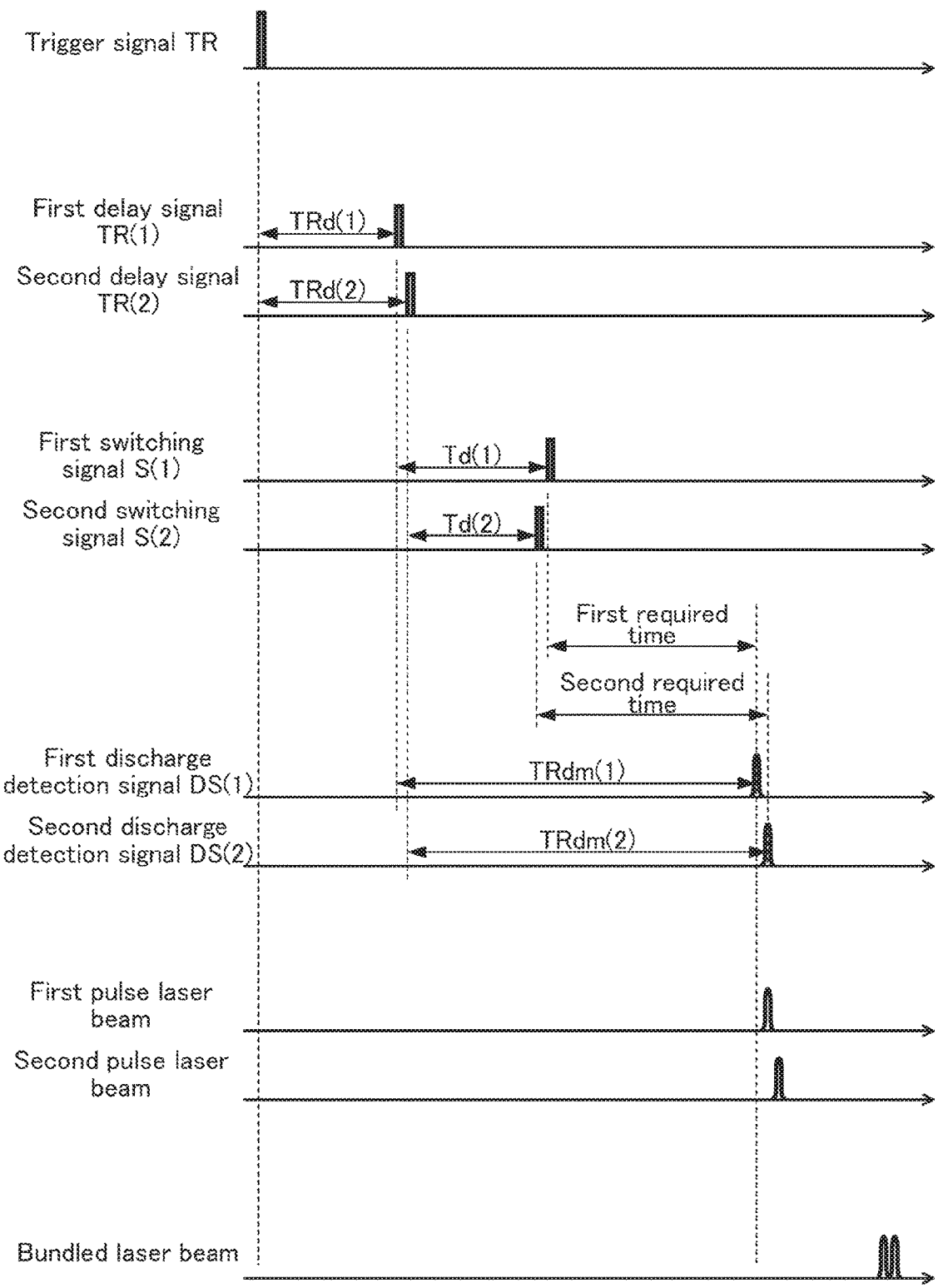
FIG. 3 is a timing chart in the laser system shown in FIG. 1.

FIG. 3 is a timing chart in the laser system shown in FIG. 1. The laser system controller 20 may transfer the trigger signal TR received from the annealing controller 40 to the synchronizing control unit 22.

The delay circuit unit 24 of the synchronizing control unit 22 may output the first and second delay signals TR(1) and TR(2) to the first and second trigger correction units 22a and 22b, respectively. The first and second delay signals TR(1) and TR(2) may represent that the first and second delay times TRd(1) and TRd(2) different from each other have passed, respectively, since the time of receiving the trigger signal TR.

A time period from the output timing of the first delay signal TR(1) to the output timing of the first discharge detection signal DS(1) and a time period from the output timing of the second delay signal TR(2) to the output timing of the second discharge detection signal DS(2) may preferably be substantially equal to each other. In that case, the t e difference between the first and second delay signals TR(1) and TR(2) may be substantially equal to the time difference between the first and second discharge detection signals DS(1) and DS(2).

The first and second laser apparatuses 2a and 2b may output the first and second pulse laser beams 21a and 21b, respectively. The first and second pulse laser beams 21a and 21b may be outputted simultaneously with the first and second discharge detection signals DS(1) and DS(2), respectively. Alternatively, the first and second pulse laser beams 21a and 21b may be outputted with a small delay from the first and second discharge detection signals DS(1) and DS(2), respectively.

Optical path lengths from outputting positions of the first and second laser apparatuses 2a and 2b to an emitting position of the beam bundling device 3 may be substantially equal to each other. In that case, the bundled laser beam 21 emitted from the beam bundling device 3 may be a combination of the first and second pulse laser beams 21a and 21b having a time difference substantially equal to a time difference between the first and second delay signals TR(1) and TR(2). Controlling the timing of the first and second delay signals TR(1) and TR(2) may thus enable the pulse waveform of the bundled laser beam 21 to be controlled.

If the optical path lengths from the outputting positions of the first and second laser apparatuses 2a and 2b to the emitting position of the beam bundling device 3 are not equal to each other, the timing of the first and second delay signals TR(1) and TR(2) may be corrected based on a value obtained by dividing the difference in the optical path lengths by the velocity of light.

As shown in FIG. 3, the first delay signal TR(1) and the second delay signal TR(2) may have a predetermined time difference. Here, a first required time for the first laser apparatus 2a from the time of receiving the first switching signal S(1) to the time of generating the first pulse laser beam may change according to the charging voltage of the storage capacitor C0 of the first laser apparatus 2a. A second required time for the second laser apparatus 2b from the time of receiving the second switching signal S(2) to the time of generating the second pulse laser beam may change according to the charging voltage of the storage capacitor C0 of the second laser apparatus 2b. These values of the charging voltage in the first and second laser apparatuses 2a and 2b may be controlled separately from each other. The first required time and the second required time may thus be separately changed. Also, the first required time and the second required time may each be changed according to the temperature of the magnetic compression circuit included in the pulse power module 13.

The first elapsed time TRdm(1) from the time at which the timer 27 receives the first delay signal TR(1) to the time at which the timer 27 receives the first discharge detection signal DS(1) may correspond to a total of the first correction time Td(1) and the first required time. The second elapsed time TRdm(2) from the time at which the timer 27 receives the second delay signal TR(2) to the time at which the timer 27 receives the second discharge detection signal DS(2) may correspond to a total of the second correction time Td(2) and the second required time.

To adjust the first elapsed time TRdm(1) to a target value, the first correction time Td(1) may need to be changed according to change in the first required time. To adjust the second elapsed time TRdm(2) to a target value, the second correction time Td(2) may need to be changed according to change in the second required time By adjusting the first elapsed time TRdm(1) and the second elapsed time TRdm(2) to the same target value, the first pulse laser beam 21a and the second pulse laser beam 21b may be generated at a time difference substantially equal to the time difference between the first delay signal TR(1) and the second delay signal TR(2).

Figure 4:
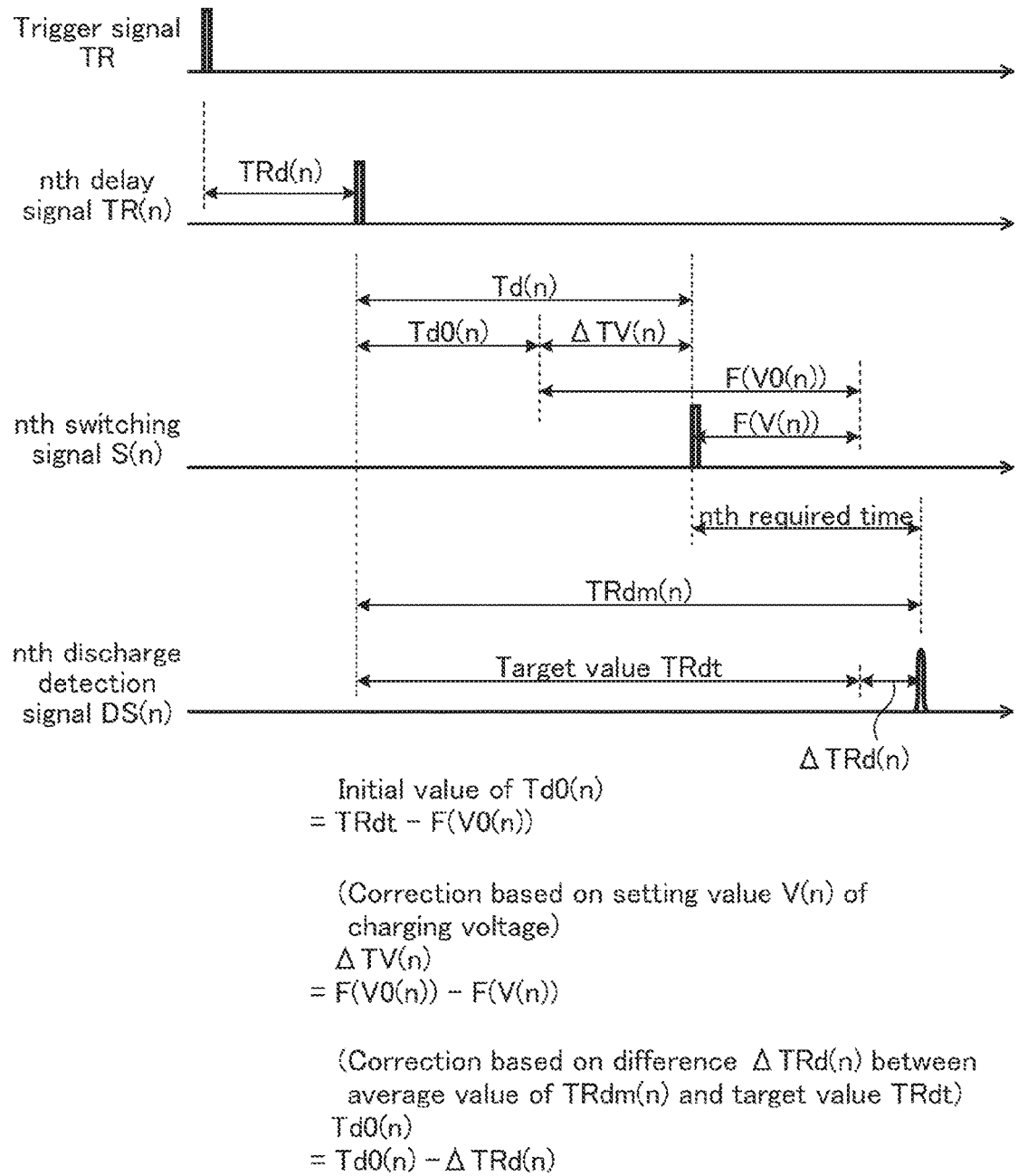
FIG. 4 is a timing chart specifically showing a correcting method in an nth trigger correction unit.

FIG. 4 is a timing chart specifically showing a correcting method in an nth trigger correction unit. In the following description, each of the first and second trigger correction units 22a and 22b may be referred to as an nth trigger correction unit 22n. A signal inputted to or outputted from the nth trigger correction unit 22n may be labeled with a suffix (n), or a time to be set for the nth trigger correction unit 22n may be labeled with a suffix (n).

The nth correction time Td(n) may be calculated by the following formula.

$$Td(n)=Td0(n)+\Delta TV(n)$$

Here, Td0(n) is a first correction element, and $\Delta TV(n)$ is a second correction element.

An initial value of the first correction element Td0(n) may be set by the following formula.

Initial value of $Td0(n)$ $$=TRdt-F(V0(n))$$

Here, TRdt may be a target value of the nth elapsed time TRdm(n). The nth elapsed time. TRdm(n) may be an elapsed time from the time at which the timer 27 receives the nth delay signal TR(n) to the time at which the timer 27 receives the nth discharge detection signal DS(n). In the following, description will be provided on the case that the target value TRdt of the nth elapsed time TRdm(n) is commonly used for the first and second trigger correction units 22a and 22b. However, separate target values may be set for the first and second trigger correction units 22a and 22b.

In the formula described above, F(V0(n)) may be a calculated value of the required time from the time of inputting the nth switching signal S(n) to the time of outputting the nth discharge detection signal DS(n), in the case where the setting value of the charging voltage in an nth laser apparatus 2n is equal to a predetermined reference voltage value V0(n). If the charging voltage changes alone in the magnetic compression circuit included in the pulse power module 13, a product of the charging voltage and a required time T from the time of inputting the nth switching signal S(n) to the switch 13a to the time of applying the pulsed high voltage between the pair of electrodes 11a and 11b may be a substantially constant value K. Calculation of F(V0(n)) may thus be made by the following formula.

$$F(V0(n))=K/V0(n)$$

Here, V0(n) may be the reference voltage value.

If the setting value of the charging voltage in the nth laser apparatus 2n is a voltage value V(n) different from the predetermined reference voltage value V0(n), the second correction element $\Delta TV(n)$ may be calculated by the following formula.

$$\Delta TV(n)=F(V0(n))-F(V(n))$$

Here, $F(V(n))$ may be a calculated value of the required time from the time of inputting the nth switching signal $S(n)$ to the time of outputting the nth discharge detection signal $DS(n)$, in a case where the setting value of the charging voltage in the nth laser apparatus $2n$ is $V(n)$. Calculation of $F(V(n))$ may be made by the following formula.

$$F(V(n))=K/V(n)$$

Calculating the second correction element $\Delta TV(n)$ based on the setting value $V(n)$ of the charging voltage as described above may achieve rapid timing control of the nth switching signal $S(n)$.

If the processor 25 of the nth trigger correction unit $22n$ receives the nth elapsed time $TRdm(n)$ from the time at which the time 27 receives the nth delay signal $TR(n)$ to the time at which the timer 27 receives the nth discharge detection signal $DS(n)$, the processor 25 may calculate a difference $\Delta TRd(n)$ between the nth elapsed time $TRdm(n)$ and the target value $TRdt$. The difference $\Delta TRd(n)$ may be calculated by the following formula.

$$\Delta TRd(n)=\text{AVG}(TRdm(n))-TRdt$$

Here, $\text{AVG}(TRdm(n))$ may be an average value of $TRdm(n)$ measured for a plurality of times.

The first correction element $Td0(n)$ may be updated by the following formula based on the calculated difference $\Delta TRd(n)$.

$$Td0(n)=Td0(n)-\Delta TRd(n)$$

The first correction element $Td0(n)$ may be updated as described above based on the difference $\Delta TRd(n)$ between the average value of the nth elapsed time $TRdm(n)$ and the target value $TRdt$. This may enable a correction according to change in the nth required time due to, for example, change in temperature of the magnet compression circuit or change in gas pressure in the laser chamber. The timing control of the nth switching signal $S(n)$ may thus be made with high accuracy. In this specification, change in the discharge timing due to change in temperature of the magnetic compression circuit or change in the discharge timing due to change in gas pressure in the laser chamber is to be called "drifting change".

1.8 Flowchart 1.8.1 Process of Laser System Controller

Figure 5:
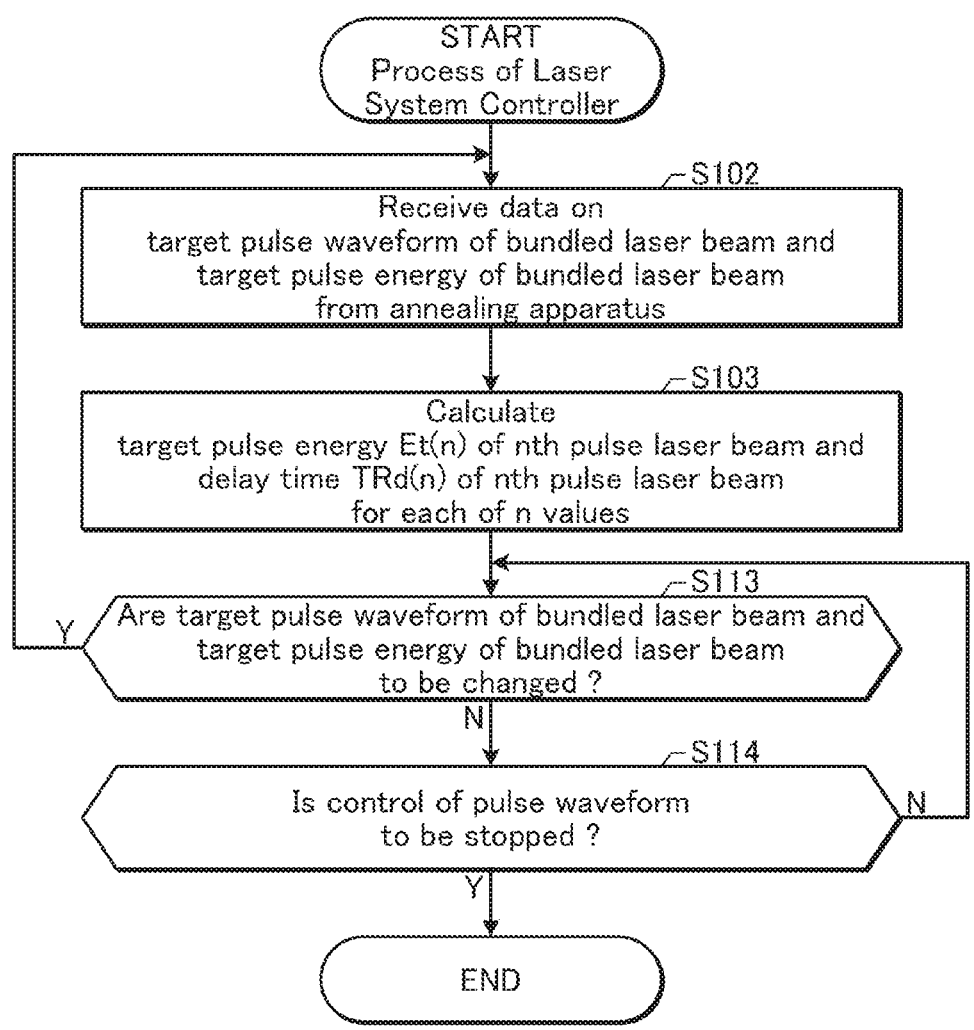
FIG. 5 is a flowchart showing a process of a laser system controller shown in FIG. 1.

FIG. 5 is a flowchart showing a process of the laser system controller shown in FIG. 1. The laser system controller 20 may calculate, in the following process, the target pulse energy $Et(n)$ and the nth delay time $TRd(n)$ of an nth pulse laser beam $21n$ outputted from the nth laser apparatus $2n$ for each of the n values.

First, at S102, the laser system controller 20 may receive, from the annealing controller 40 of the annealing apparatus 4, data on target pulse waveform of the bundled laser beam 21 and data on target pulse energy of the bundled laser beam 21.

Next, at S103, the laser system controller 20 may calculate the target pulse energy $Et(n)$ and the nth delay time $TRd(n)$ of the nth pulse laser beam $21n$ for each of the n values. For example, if the target pulse waveform of the bundled laser beams 21 has a short pulse width, values of the nth delay time $TRd(n)$ for different n values may be close to each other. Further, the target pulse energy $Et(n)$ of the nth pulse laser beam $21n$ may be set such that a total of values of the target pulse energy $Et(n)$ of the nth pulse laser beam $21n$ for all of the n values is close to the target pulse energy of the bundled laser beam 21.

After calculating the target pulse energy $Et(n)$ of the nth pulse laser bean $21n$ for each of the n values, the laser system controller 20 may send the value of target pulse energy $Et(n)$ to the laser controller 19 of the corresponding laser apparatus.

After calculating the nth delay time $TRd(n)$ of the nth pulse laser beam $21n$ for each of the n values, the laser system controller 20 may send the values of the nth delay time $TRd(n)$ to the delay circuit unit 24 of the synchronizing control unit 22.

Next, at S113, the laser system controller 20 may determine whether the target pulse waveform of the bundled laser beam 21 and the target pulse energy of the bundled laser beam 21 are to be changed. If these target values are to be changed (S113: YES), the laser system controller 2 may return to S102 described above. If these target values are not to be changed (S113: NO), the laser system controller 20 may proceed to S114.

Next, at S114, the laser system controller 20 may determine whether the control of the pulse waveform is to be stopped. If the control the pulse waveform is not to be stopped (S114: NO), the laser system controller 20 may return to S113 described above. If the control of the pulse waveform is to be stopped (S114: YES), the laser system controller 20 may end the process of this flowchart.

The laser system controller 20 may thus calculate the target pulse energy $Et(n)$ and the nth delay time $TRd(n)$.

1.8.2 Process of Laser Controller

Figure 6:
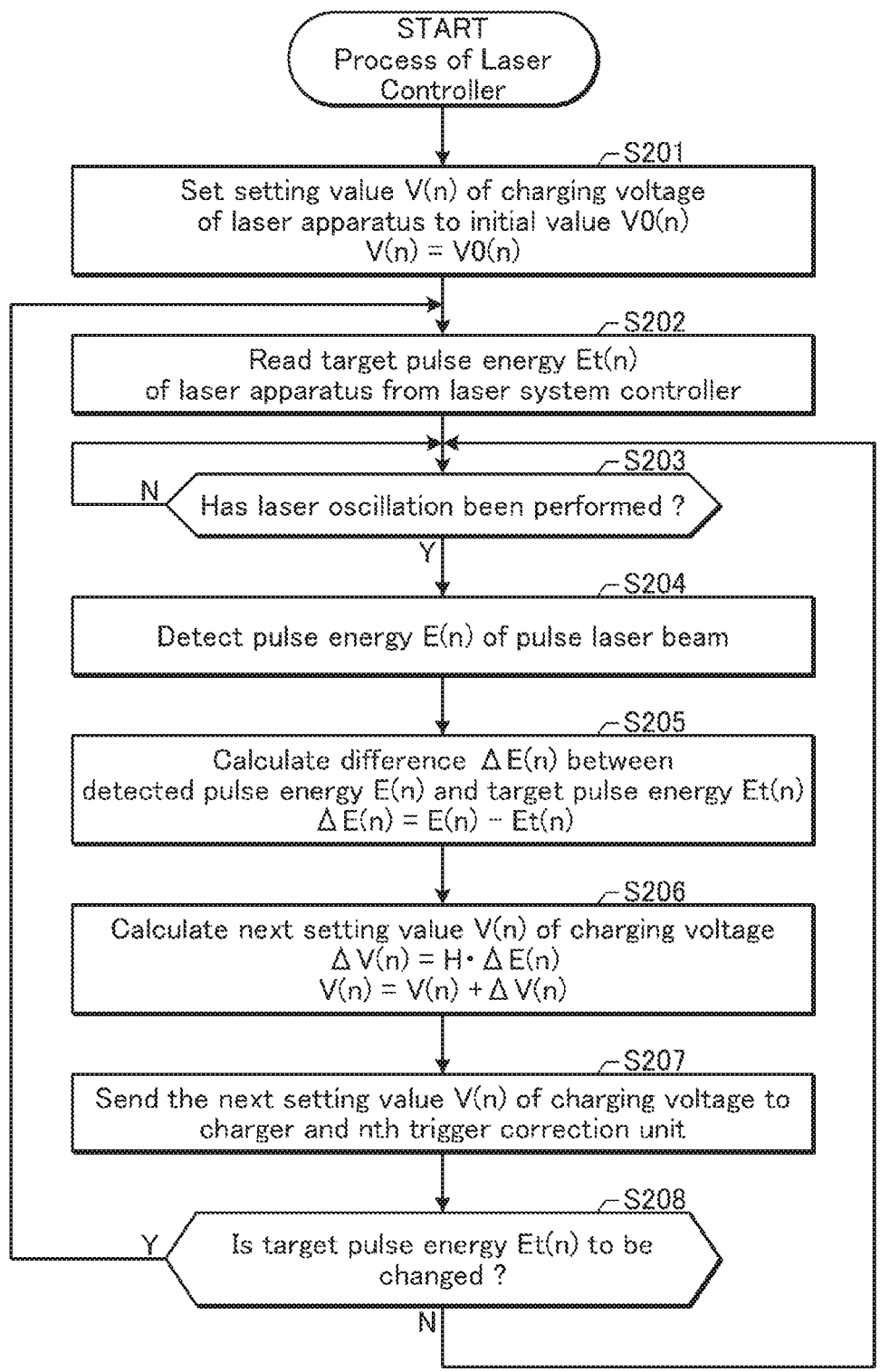
FIG. 6 is a flowchart showing a process of a laser controller shown in FIG. 2.

FIG. 6 is a flowchart showing a process of the laser controller shown in FIG. 2. The laser controller 19 included in the nth laser apparatus $2n$ may calculate, in the following process, the setting value $V(n)$ of the charging voltage based on the target pulse energy $Et(n)$.

First, at S201, the laser controller 19 may set to setting value $V(n)$ of the charging voltage of the laser apparatus $2n$ to an initial value. The initial value of the setting value of the charging voltage may be the reference voltage value $V0(n)$ described above.

Next, at S202, the laser controller 19 may read the target pulse energy $Et(n)$ of the laser apparatus $2n$ from the laser system controller 20.

Next, at S203, the laser controller 19 may determine whether the laser apparatus $2n$ has performed laser oscillation. If the laser apparatus $2n$ has not performed laser oscillation (S203: NO), the laser controller 19 may wait until the laser apparatus $2n$ performs laser oscillation. If the laser apparatus $2n$ has performed laser oscillation (S203: YES), the laser controller 19 may proceed to S204.

At S204, the laser controller 19 may detect the pulse energy $E(n)$ of the pulse laser beam $21n$ outputted from the laser apparatus $2n$. The pulse energy $E(n)$ may be detected by the pulse energy measuring unit 17.

Next, S205, the laser controller 19 may calculate a difference $\Delta E(n)$ between the detected pulse energy $E(n)$ and the target pulse energy $Et(n)$ by the following formula.

$$\Delta E(n)=E(n)-Et(n)$$

Next, at S206, the laser controller 19 may calculate, based on the difference $\Delta E(n)$ between the detected pulse energy $E(n)$ and the target pulse energy $Et(n)$, an amount of change $\Delta V(n)$ in the setting value of the charging voltage by the following formula.

$$\Delta V(n)=H\cdot\Delta E(n)$$

Here, H may be a constant of proportionality. The amount of change $\Delta V(n)$ in the setting value of the charging voltage may represent an a count of change for a next setting value V(n) of the charging voltage. The laser controller 19 may calculate the next setting value V(n) of the charging voltage by the following formula.

$$V(n)=V(n)+\Delta V(n)$$

Next, at S207, the laser controller 19 may send the next setting value V(n) of the charging voltage to the charger 12 and to the processor 25 of the nth trigger correction unit 22*n*.

Next, at S208, the laser controller 19 may determine whether the target pulse energy Et(n) is to be changed. If the target pulse energy Et(n) is to be changed (S208: YES), the laser controller may return to S202 described above. If the target pulse energy Et(n) not to be changed (S208: NO), the laser controller may return to S203 described above.

The laser controller 19 may thus calculate the setting value V(n) of the charging voltage.

1.8.3 Process of nth Trigger Correction Unit

Figure 7:
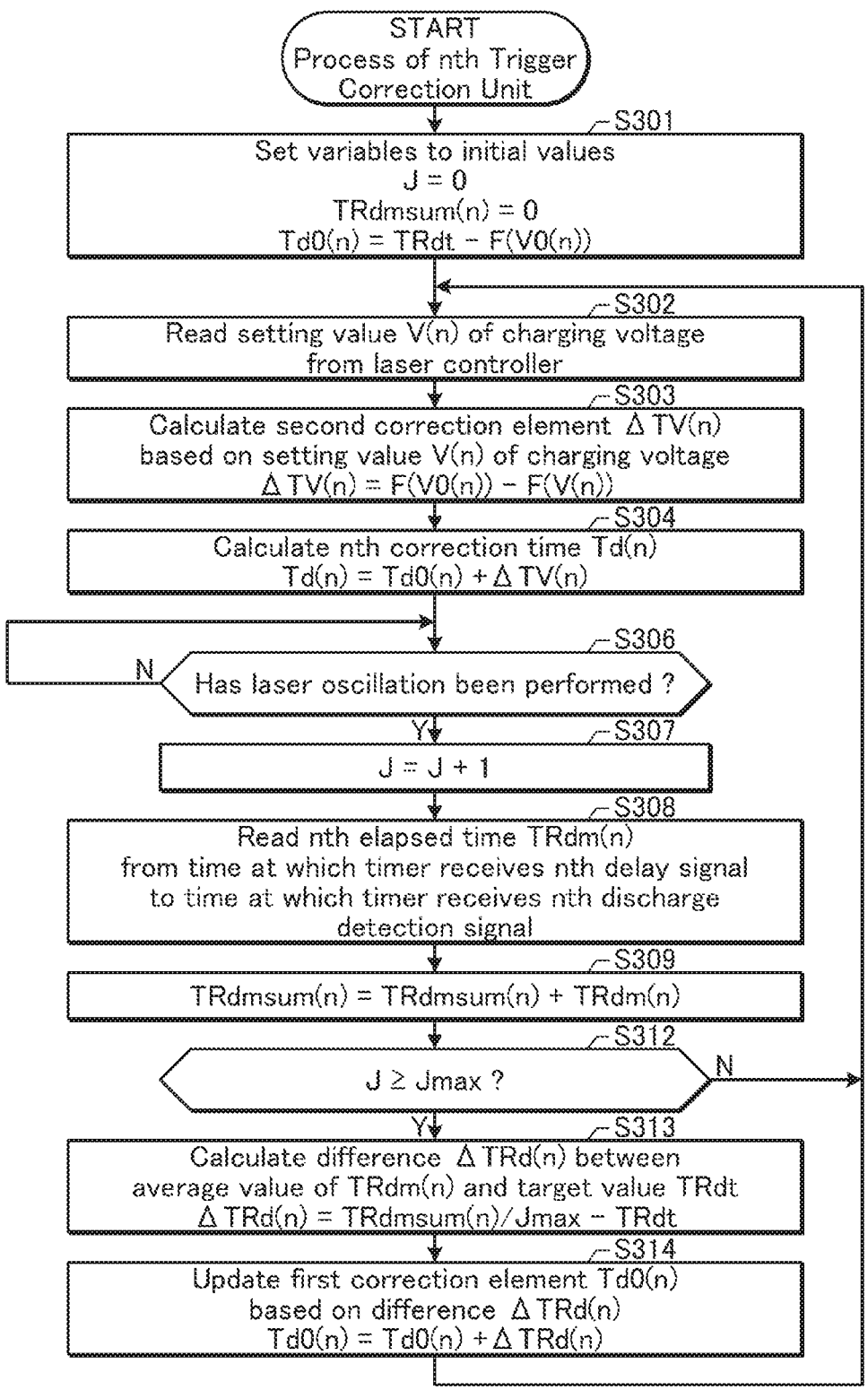
FIG. 7 is a flowchart showing a process of the nth trigger correction unit shown in FIG. 2.

FIG. 7 is a flowchart showing a process of the nth trigger correction unit shown in FIG. 2. The nth trigger correction unit 22*n* may calculate, in the process described below, the first correction element Td0(n) and the second correction element $\Delta TV(n)$, both constituting the nth correction time Td(n).

First, at S301, the nth trigger correction unit 22*n* may set some variables to respective initial values as follows.

$$J=0$$

$$TRdm\text{sum}(n)=0$$

$$Td0(n)=TRdt-F(V0n))$$

Here, J may be a counter for counting the number of pulses of oscillation. TRdmsum(n) may be a total value of TRdm(n) for calculating the average value of the nth elapsed time TRdm(n) for all of the n values. The nth elapsed time TRdm(n) may be an elapsed time from the time at which the timer 27 receives the nth delay signal TR(n) to the time at Which the timer 27 receives the nth discharge detection signal DS(n). Td0(n) may be the first correction element. TRdt−F(V0(n)) may be the initial value of the first correction element described above.

Next, at S302, the nth trigger correction unit 22*n* may read the setting value V(n) of the charging voltage from the laser controller 19.

Next, at S303, the nth trigger correction unit 22*n* may calculate the second correction element $\Delta TV(n)$ based on the setting value V(n) of the charging voltage by the following formula.

$$\Delta TV(n)=F(V0(n))-F(V(n))$$

Next, at S304, the nth trigger correction unit 22*n* may calculate the nth correction time Td(n) by the following formula.

$$Td(n)=Td0(n)+\Delta TV(n)$$

Here, Td0(n) may be the first correction element, and $\Delta TV(n)$ may be the second correction element.

Next, at S306, the nth trigger correction unit 22*n* may determine whether the nth laser apparatus 2*n* has performed laser oscillation. Whether the nth laser apparatus 2*n* has performed laser oscillation may be determined based on whether the timer 27 has received the nth discharge detection signal DS(n) from the discharge sensor 18. If the nth laser apparatus 2*n* has performed laser oscillation (S306: YES), the nth trigger correction unit 22*n* may proceed to S307. It the nth laser apparatus 2*n* has not performed laser oscillation (S306: NO), the nth trigger correction unit 22*n* may wait until the nth laser apparatus 2*n* performs laser oscillation.

At S307, the nth trigger correction unit 22*n* may add 1 to the present value of the counter J to update the value of J.

Next, at S308, the nth trigger correction unit 22*n* may read, from the timer 27, the nth elapsed time TRdm(n) from the time at which the timer 27 receives the nth delay signal TR(n) to the time at which the timer 27 receives the nth discharge detection signal DS(n).

Next, at S309, the nth trigger correction unit 22*n* may update the total value TRdmsum(n) of TRdm(n) by the following formula.

$$TRdm\text{sum}(n)=TRdm\text{sum}(n)+TRdm(n)$$

Next, at S312, the nth trigger correction unit 22*n* may determine whether the value of the counter J has reached a predetermined value Jmax representing the number of samples. If the value of the counter J has not reached the predetermined value Jmax (S312: NO), the nth trigger correction unit 22*n* may return to S302 described above. If the value of the counter J has reached the predetermined value Jmax (S312: YES), the nth trigger correction unit 22*n* may proceed to S313.

At S313, the nth trigger correction unit 22*n* may calculate the difference $\Delta TRd(n)$ between the average value of TRdm(n) and the target value TRdt. The difference $\Delta TRd(n)$ may be calculated by the following formula.

$$TRd(n)=\text{AVG}(TRdm(n))-TRdt$$

$$=TRdm\text{sum}(n)/J\text{max}-TRdt$$

Next, at S314, the nth trigger correction unit 22*n* may update the first correction element Td0(n) by the following formula.

$$Td0(n)=Td0(n)-\Delta TRd(n)$$

After updating the first correction element Td0(n), the nth trigger correction unit 22*n* may return to S302 described above.

The nth trigger correction unit 22*n* may thus calculate the nth correction time Td(n) while updating the first correction element Td0(n) and the second correction element $\Delta TV(n)$. The second correction element $\Delta TV(n)$ may be updated at every one pulse of oscillation described above. The first correction element Td0(n) may be updated at every Jmax pulses of oscillation as described above, where Jmax is the predetermined value representing the number of samples. The predetermined value Jmax may be, for example, 200 or more and 10000 or less. As described above, the frequency of setting operation to set the nth correction time Td(n) by updating the first correction element Td0(n) may be lower than the frequency of setting operation to set the nth correction time Td(n) by updating the second correction element $\Delta TV(n)$.

In the comparative example described above, the nth trigger correction unit 22*n* may correct the nth correction time Td(n) based on the change in the nth required time and thus the nth elapsed time TRdm(n) may approach the target value TRdt. Specifically, the control of the correction time based on the setting value of the charging voltage and the control of the correction time based on the change in the nth required time due to the drifting change may be possible. Thus, the discharge timing of each laser apparatus may be stabilized and the pulse waveform of the bundled laser beam may be stabilized.

The control of the pulse waveform of the bundled laser beam may be achieved by the control of the nth delay time TRd(n) performed by the delay circuit unit 24, separately from the control performed by the nth trigger correction unit 22*n*.

In the comparative example described above, the unillustrated clock signal generation unit may generate the clock signal commonly used for the first and second trigger correction units 22*a* and 22*b* and the delay circuit unit 24. An unconformity in the delay time TRd(n) or in the correction time Td(n) may thus be reduced.

If the electric between the synchronizing control unit 22 and each laser apparatus is long, an electric signal may delay by l/c assuming that the length of the electric wire is l. Here, c is the velocity of light. A correction may be made for the delay of the switching signal S(n) to each pulse power module and the delay of the timing signal from each discharge sensor based on the length of the electric wire. Signals via optical fibers may also delay, similarly to the signals via the electric wire, which may be corrected in the same manner.

In the comparative example described above, control of the pulse waveform of the bundled laser beam may be performed by the delay circuit unit 24 to control the nth delay time TRd(n). However, without being limited to this, another configuration described below may be possible. In place of the delay circuit unit 24, a distributor may be provided to distribute the trigger signal TR from the annealing controller 40 without delay. Target values TRdt(n) different from each other may be set for the trigger correction units 22*n* of the respective laser apparatuses to control the timing of the pulse laser beams outputted from the respective laser apparatuses.

In the above description, the laser controller 19 of each of the laser apparatuses, the laser system controller 20, and the synchronizing control unit 22 may perform the control of the laser apparatuses. However, without being limited to this, the annealing controller 40 included in the annealing apparatus 4 may perform the various controls.

1.9 Problem

In the comparative example described above, the second correction element ΔTV(n) may be calculated based on the setting value V(n) of the charging voltage. However, the actual charging voltage of the storage capacitor C0 may shift from the setting value V(n) of the charging voltage. In that case, accuracy in synchronization of the pulse laser outputted from the respective laser apparatuses may become worse.

The pulse waveform of the bundled laser beam made by bundling the pulse laser beams may thus be changed, which may affect annealing quality.

In the embodiments described below, a charging voltage measuring unit commonly used for the laser apparatuses may measure the actual charging voltage with high accuracy, and a bleeding circuit and the trigger correction unit may be operated based on the measured charging voltage.

2. Laser System That Controls Bleeding Circuit Based on Measured Charging Voltage (First Embodiment)

2.1 Configuration

Figure 8:
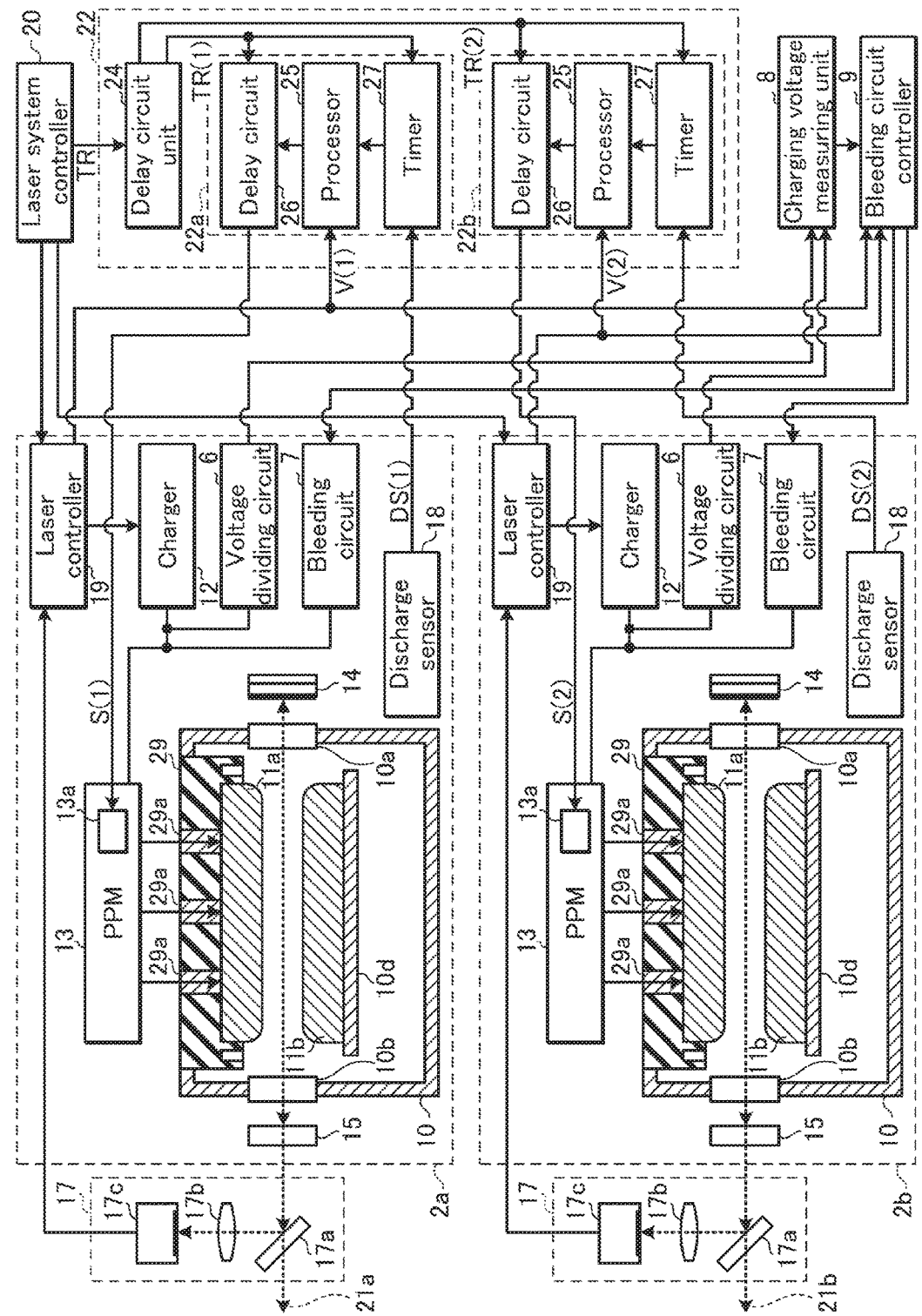
FIG. 8 schematically shows a configuration of a laser system according to a first embodiment of the present disclosure.

FIG. 8 schematically shows a configuration of a laser system according to a first embodiment of the present disclosure. General configuration of the laser annealing apparatus 1 in the first embodiment may be substantially the same as shown in FIG. 1.

In the first embodiment, each of the first and second laser apparatuses 2*a* and 2*b* may further include a voltage dividing circuit 6 and a bleeding circuit 7. The laser system 5 may further include a charging voltage measuring unit 8 and a bleeding circuit controller 9.

In each of the first and second laser apparatuses 2*a* and 2*b*, the voltage dividing circuit 6 and the bleeding circuit 7 may be connected to an electric wire that connects the charger 12 and the storage capacitor C0 of the pulse power module 13. The voltage dividing circuit 6 included in each of the first and second laser apparatuses 2*a* and 2*b* may be connected to the charging voltage measuring unit 8. The charging voltage measuring unit 8 may be connected to the bleeding circuit controller 9. The bleeding circuit controller 9 may be connected to signal lines that connect the laser controllers 19 of the first and second laser apparatuses 2*a* and 2*b* and the processors 25 of the trigger correction units for the respective laser apparatuses. The bleeding circuit controller 9 may further be connected to the bleeding circuit included in each of the first and second laser apparatuses 2*a* and 2*b*.

Figure 9:
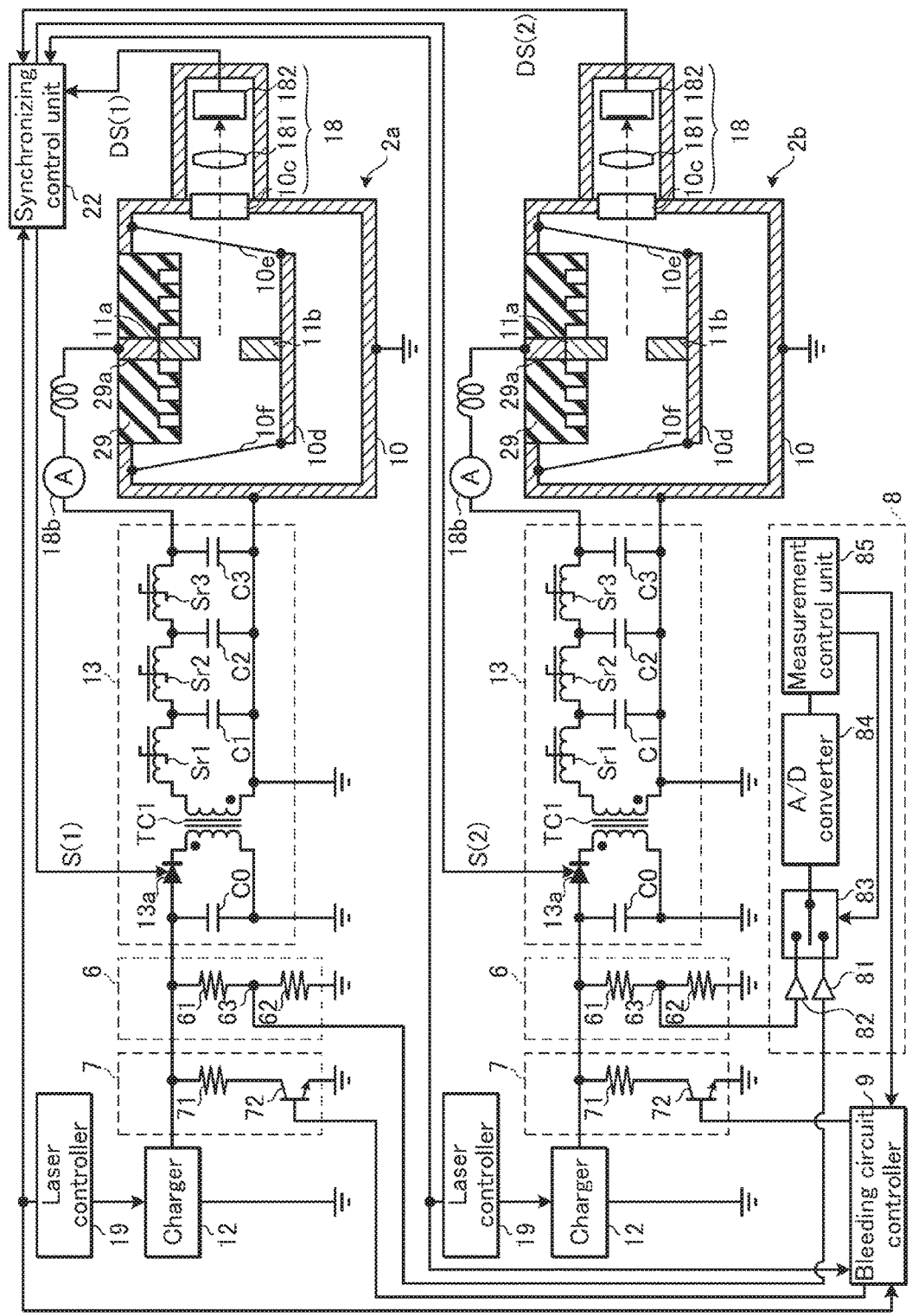
FIG. 9 shows an internal configuration of each laser chamber in the first embodiment as viewed in a direction substantially parallel to a traveling direction of a pulse laser beam.

FIG. 9 shows an internal configuration of each laser chamber in the first embodiment as viewed in a direction substantially parallel to the traveling direction of the pulse laser beam. FIG. 9 also shows a configuration of the pulse power module 13, the discharge sensor 18, the voltage dividing circuit 6, the bleeding circuit 7, and the charging voltage measuring unit 8 shown in FIG. 8. The conducting member of the laser chamber 10 including the wall of the laser chamber 10 may be connected to the ground potential. The electrode 11*b* may be connected to the ground potential, via the return plate 10*d*, the electric wires 10*e* and 10*f*, and the wall of the laser chamber 10.

The discharge sensor 18 included in each of the first and second laser apparatuses 2*a* and 2*b* may include a window 10*c* attached to the laser chamber 10, a focusing optical system 181, and an optical sensor 182.

The window 10*c* may transmit light generated by the electric discharge between the pair of electrodes 11*a* and 11*b*. The focusing optical system 181 may concentrate the light transmitted by the window 10*c* on the light receiving surface of the optical sensor 182. The optical sensor 182 may include a photodiode or a photoelectric tube. The optical sensor 182 may detect the light generated by the electric discharge between the pair of electrodes 11*a* and 11*b* and may send the nth discharge detection signal DS(n) showing the discharge timing to the synchronizing control unit 22.

The pulse power module 13 may include the storage capacitor C0, the switch 13*a*, a boosting transformer TC1, magnetic switches Sr1 to Sr3, and condensers C1 to C3. The boosting transformer TC1, the magnetic switches Sr1 to Sr3, and the condensers C1 to C3 may constitute the magnetic compression circuit.

Each of the magnetic switches Sr1 to Sr3 may include a saturable reactor. Each of the magnetic switches Sr1 to Sr3 may be switched to have a low impedance value when the time-integrated value of the voltage applied between both ends of the magnetic switch becomes a predetermined value according to the characteristic of the magnetic switch.

The laser controller 19 may set the setting value V(n) of the charging voltage for the charger 12. The charger 12 may charge the storage capacitor C0 according to the setting value V(n) of the charging voltage.

The synchronizing control unit 22 may input the switching signal to the switch 13*a* of the pulse power module 13. If the switching signal is inputted to the switch 13*a*, the switch 13*a* may turn ON. If the switch 13*a* turns ON, current may flow from the storage capacitor C0 to a primary side of the boosting transformer TC1.

If the current flows to the primary side of the boosting transformer TC1, current in the opposite direction caused by electromagnetic induction may flow in a secondary side of the boosting transformer TC1. If the current flows in the secondary side of the boosting transformer TC1, the time-integrated value of the voltage applied to the magnetic switch Sr1 may eventually reach the threshold value.

If the time-integrated value of the voltage applied to the magnetic switch Sr1 reaches the threshold value, the magnetic switch Sr1 may become magnetically saturated, and the magnetic switch Sr1 may close.

If the magnetic switch Sr1 closes, current from the secondary side of the boosting transformer TC1 may flow to the condenser C1, and the condenser C1 may be charged.

Charging the condenser C1 may cause the magnetic switch Sr2 to be magnetically saturated, and the magnetic switch Sr2 may close.

If the magnetic switch Sr2 closes, current may flow from the condenser C1 to the condenser C2, and the condense C2 may be charged. Here, the pulse width of the current to charge the condenser C2 may be shorter than that to charge the condenser C1.

Charging the condenser C2 may cause the magnetic switch Sr3 to be magnetically saturated, and the magnetic switch Sr3 may close.

If the magnetic switch Sr3 closes, current may flow from the condenser C2 to the condenser C3, and the condenser C3 may be charged. Here, the pulse width of the current to charge the condenser C3 may be shorter than that to charge the condenser C2.

While the current sequentially flows from the condenser C1 to the condenser C2 and from the condenser C2 to the condenser C3, the pulse width of the current may be compressed.

When the voltage of the condenser C3 reaches the breakdown voltage of the laser gas, insulation breakdown may occur between the pair of electrodes 11a and 11b. The laser gas may thus be excited to cause laser oscillation, and the pulse laser beam may be outputted. Such discharge operation may be repeated according to the switching operation of the switch 13a, and the pulse laser beam may be outputted at a predetermined oscillating frequency. As a discharge timing detector in place of the discharge sensor 18, an ammeter 18b to detect the discharge current may be used. The ammeter 18b may be an electric current probe to detect the timing of the electric discharge.

Alternatively, as the discharge timing detector in place of the discharge sensor 18, the pulse energy measuring unit 17 (see FIG. 8) may be used. The pulse energy measuring unit 17 may include a high-speed photodiode.

The voltage dividing circuit 6 included in each of the first and second laser apparatuses 2a and 2b may include a first resistance element 61 and a second resistance element 62. The first resistance element 61 may be connected to the electric wire that connects the charger 12 and the storage capacitor C0 of the pulse power module 13. The second resistance element 62 may be connected between the first resistance element 61 and the ground potential. An output terminal 63 between the first resistance element 61 and the second resistance element 62 may be connected to the charging voltage measuring unit 8. The resistance value of the first resistance element 61 may be more than 10 times as high as that of the second resistance element 62. A voltage signal from the output terminal 63 may be obtained by dividing the charging voltage of the storage capacitor C0 according to the ratio of the resistance value of the second resistance element 62 to the resistance value of the first resistance element 61.

The charging voltage measuring unit 8 may include a first amplifier 81, a second amplifier 82, a multiplexer 83, an A/D converter 84, and a measurement control unit 85. The first amplifier 81 may amplify the voltage signal outputted from the voltage dividing circuit 6 included in the first laser apparatus 2a and output the amplified voltage signal to a first channel of the multiplexer 83. The second amplifier 82 may amplify the voltage signal outputted from the voltage dividing circuit 6 included in the second laser apparatus 2b and output the amplified voltage signal to a second channel of the multiplexer 83. Further, the multiplexer 83 may be connected to the A/D converter 84. The multiplexer 83 may be a switch capable of switching between a first mode where the output from the first amplifier 81 is inputted to the A/D converter 84 and a second mode where the output from the second amplifier 82 is inputted to the A/D converter 84.

The A/D converter 84 may convert the analog voltage signal inputted from the multiplexer 83 to digital data on voltage and output the data to the measurement control unit 85. The A/D converter 84 connected to the multiplexer 83 may be the measuring unit commonly used to measure the charging voltages of the laser apparatuses. The measurement control unit 85 may be connected to the multiplexer 83 and the A/D converter 84 via respective signal lines and may control the multiplexer 83 and the A/D converter 84. The measurement control unit 85 may output the data on the voltage received from the A/D converter 84 to the bleeding circuit controller 9.

The bleeding circuit controller 9 may compare the setting value V(1) of the charging voltage set by the laser controller 19 of the first laser apparatus 2a and the charging voltage Vm(1) of the storage capacitor C0 of the first laser apparatus 2a. The charging voltage Vm(1) is measured by the charging voltage measuring unit 8. Based on the results of this comparison, the bleeding circuit controller 9 may output a switch ON signal to the bleeding circuit 7 of the first laser apparatus 2a.

The bleeding circuit controller 9 may compare the setting value V(2) of the charging voltage set by the laser controller 19 of the second laser apparatus 2b and the charging voltage Vm(2) of the storage capacitor C0 of the second laser apparatus 2b. The charging voltage Vm(2) is measured by the charging voltage measuring unit 8. Based on the results of this comparison, the bleeding circuit controller 9 may output a switch ON signal to the bleeding circuit 7 of the second laser apparatus 2b.

The bleeding circuit 7 included in each of the first and second laser apparatuses 2a and 2b may include a resistance element 71 and a bipolar transistor 72. As shown in FIG. 9, the electric wire that connects the charger 12 and the storage capacitor C0 of the pulse power module 13 may be connected to the resistance element 71, and a solid switch such as the bipolar transistor 72 may be connected between the resistance element 71 and the ground potential. The terminal of the bipolar transistor 72 connected to the resistance element 71 may be a collector terminal. The terminal of the bipolar transistor 72 connected to the ground potential may be an emitter terminal. Contrary to the example shown FIG. 9, the electric wire that connects the charger 12 and the storage capacitor C0 of the pulse power module 13 may be connected to the bipolar transistor 72, and the resistance element 71 may be connected between the bipolar transistor 72 and the ground potential.

The switch ON signal described above outputted from the bleeding circuit controller 9 may be inputted to a base terminal of the bipolar transistor 72. When the switch ON signal is not inputted to the base terminal, the bipolar transistor 72 may be in a substantially electrically insulating state between the collector terminal and the emitter terminal. When the switch ON signal is inputted to the base terminal of the bipolar transistor 72, the electrical resistance between the collector terminal and the emitter terminal may be reduced. The switch ON signal may cause current to flow through the resistance element 71 and the bipolar transistor 72, and thus the charging voltage of the storage capacitor C0 of the pulse power module 13 may be reduced.

2.2 Operation

2.2.1 Process of Measurement Control Unit

Figure 10:
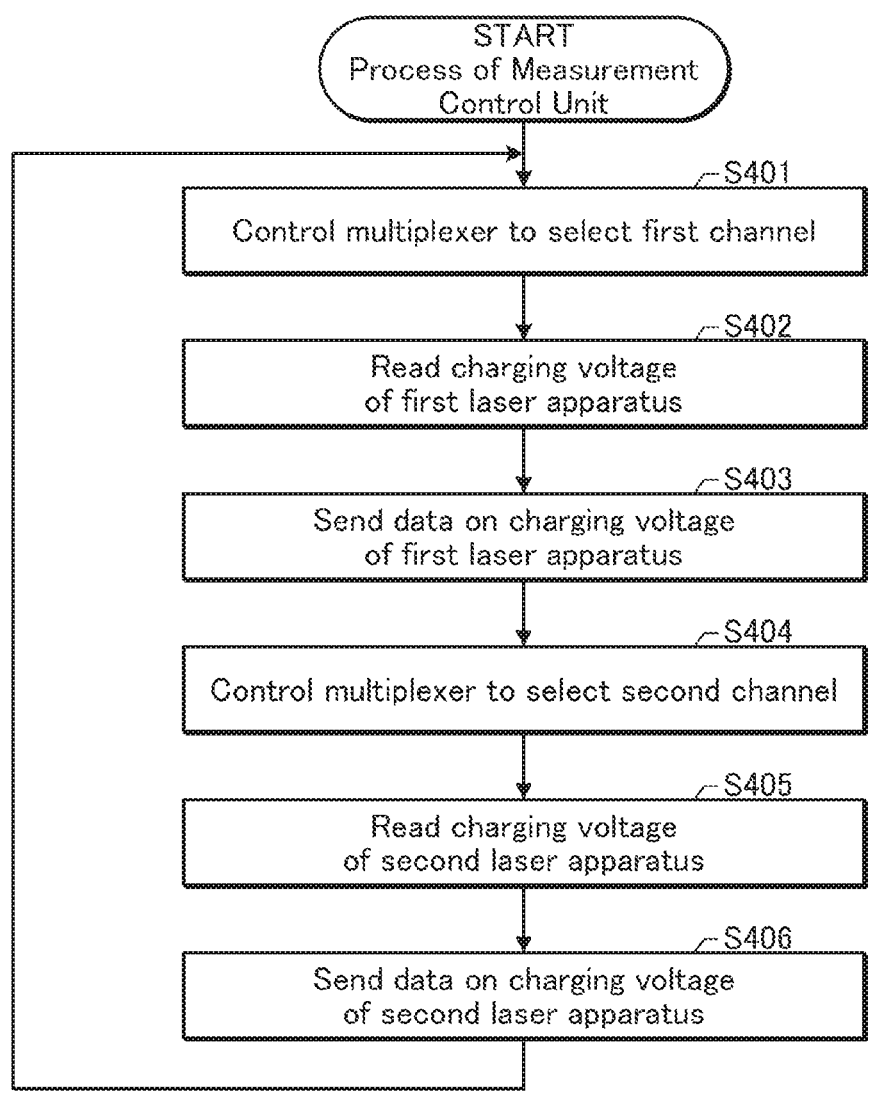
FIG. 10 is a flowchart showing a process of a measurement control unit shown in FIG. 9.

FIG. 10 is a flowchart showing a process of the measurement control unit shown in FIG. 9. The measurement control unit 85 may control, in the following process, the multiplexer 83 and the A/D converter 84 to measure the charging voltage Vm(1) of the storage capacitor C0 in the first laser apparatus 2a and the charging voltage Vm(2) of the storage capacitor C0 in the second laser apparatus 2b.

First, at S401, the measurement control unit 8 may control the multiplexer 83 to select the first channel. The storage capacitor C0 of the first laser apparatus 2a may thus be connected to the A/D converter 84 via the voltage dividing circuit 6 and the first amplifier 81.

Next, at S402, the measurement control unit 85 may read the output from the A/D converter 84 to read the charging voltage Vm(1) of the storage capacitor C0 of the first laser apparatus 2a.

Next, at S403, the measurement control unit 85 may send data on the charging voltage Vm(1) of the storage capacitor C0 of the first laser apparatus 2a to the bleeding circuit controller 9.

Next, at S404, the measurement control unit 85 may control the multiplexer 83 to select the second channel. The storage capacitor C0 of the second laser apparatus 2b may thus be connected to the A/D converter 84 via the voltage dividing circuit 6 and the second amplifier 82.

Next, at S405, the measurement control unit 85 may read the output from the A/D converter 84 to read the charging voltage Vm(2) of the storage capacitor C0 of the second laser apparatus 2b.

Next, at S406, the measurement control unit 85 may send data on the charging voltage Vm(2) of the storage capacitor C0 of the second laser apparatus 2b to the bleeding circuit controller 9.

After S406, the measurement control unit 85 may return to S401 described above.

In the process described above, the measurement control unit 85 may measure the charging voltages of the storage capacitors C0 of the first and second laser apparatuses 2a and 2b alternately.

2.2.2 Process of Bleeding Circuit Controller

Figure 11:
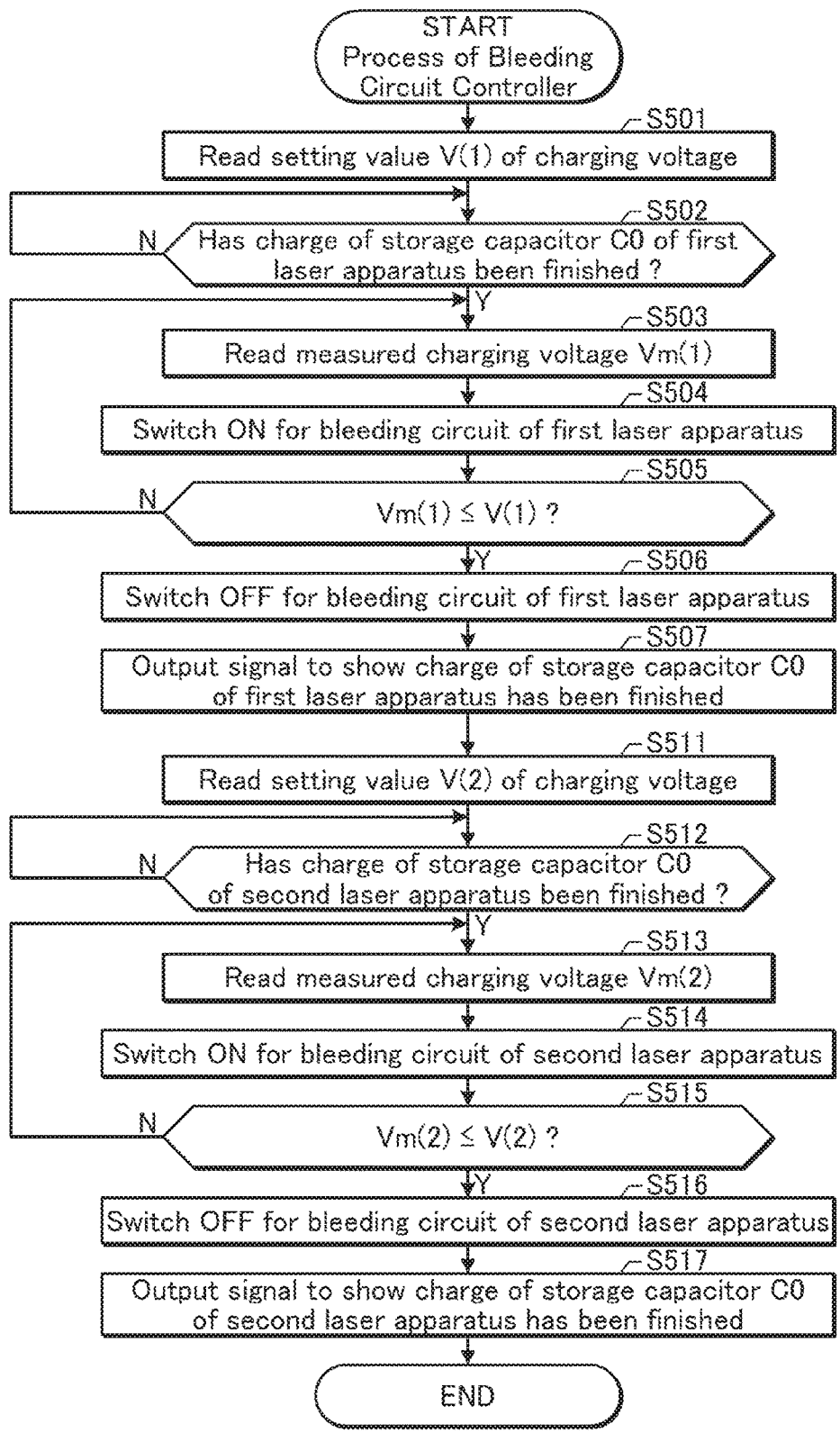
FIG. 11 is a flowchart showing a process of a bleeding circuit controller shown in FIG. 9.

FIG. 11 is a flowchart showing a process of the bleeding circuit controller shown in FIG. 9. In the following process, the bleeding circuit controller 9 may compare, for each of the first and second laser apparatuses 2a and 2b, the setting value of the charging voltage and the charging voltage of the storage capacitor C0 and may control the bleeding circuit 7.

First, at S501, the bleeding circuit controller 9 may read the setting value V(1) of the charging voltage set by the laser controller 19 of the first laser apparatus 2a.

Next, at S502, the bleeding circuit controller 9 may determine whether the charge of the storage capacitor C0 of the first laser apparatus 2a has been finished. Whether the charge of the storage capacitor C0 has been finished may be determined by whether the charging voltage Vm(1) of the storage capacitor C0 is higher than the setting value V(1) of the charging voltage.

Next, at S503, the bleeding circuit controller 9 may read the data on the charging voltage Vm(1) of the storage capacitor C0 measured by the charging voltage measuring unit 8.

Next, at S504, the bleeding circuit controller 9 may output the switch ON signal to the bleeding circuit 7 of the first laser apparatus 2a. The charging voltage of the storage capacitor C0 of the first laser apparatus 2a may thus begin to decrease.

Next, at S505, the bleeding circuit controller 9 may compare the charging voltage Vm(1) of the first laser apparatus 2a measured by the charging voltage measuring unit 8 and the setting value V(1) of the charging voltage of the first laser apparatus 2a.

If the charging voltage Vm(1) of the first laser apparatus 2a measured by the charging voltage measuring unit 8 is higher than the setting value V(1) of the charging voltage of the first laser apparatus 2a (S505: NO), the bleeding circuit controller 9 may return to S503 described above and may read new charging voltage Vm(1) to control the bleeding circuit 7. Since the switch ON signal has been outputted to the bleeding circuit 7 of the first laser apparatus 2a at S504, the charging voltage Vm(1) of the storage capacitor C0 of the first laser apparatus 2a may further decrease.

If the charging voltage Vm(1) of the first laser apparatus 2a measured by the charging voltage measuring unit 8 is equal to or less than the setting value V(1) of the charging voltage of the first laser apparatus 2a (S505: YES), the bleeding circuit controller 9 may proceed to S506.

At S506, the bleeding circuit controller 9 may stop the switch ON signal to be sent to the bleeding circuit 7 of the first laser apparatus 2a. Namely, the bleeding circuit controller 9 may turn OFF the bipolar transistor 72 included in the bleeding circuit 7 of the first laser apparatus 2a.

Next, at S507, the bleeding circuit controller 9 may send a signal showing that the charge of the storage capacitor C0 of the first laser apparatus 2a has been finished to the laser controller 19 of the first laser apparatus 2a.

As described above, the charging voltage of the storage capacitor C0 of the first laser apparatus 2a may be controlled.

After S507, the bleeding circuit controller 9 may execute a process from S511 to S517. The process from S511 to S517 may be the same as the process from S501 to S507 described above, except that each constituent element of the first laser apparatus 2a is replaced by each constituent element of the second laser apparatus 2b. The charging voltage of the storage capacitor C0 of the second laser apparatus 2b may thus be controlled.

2.3 Effect

According to the first embodiment described above, the charging voltage measuring unit commonly used for the laser apparatuses may achieve accurate measurement of the actual charging voltage. Operation of the bleeding circuit based on the actual charging voltage may allow accurate adjustment of the charging voltage to the setting value. Correction of trigger timing using the trigger correction unit may thus be performed with high accuracy.

U.S. Pat. No. 8,238,400 B discloses that the charging voltages of storage capacitors of two lasers are controlled equivalent to each other with a single switch that connects the storage capacitors of the two lasers. U.S. Pat. No. 6,865,210 B discloses that a single charger charges two storage capacitors. However, these patents, the charging voltages of the two lasers may need to be the same. Also, in these patents, the two lasers may need to be arranged adjacent to each other. In contrast, according to the present embodiment, even where the charging voltages of the two lasers are separately controlled, the charging voltages of the two lasers may be measured with high accuracy. Even where the two lasers are distanced from each other, the charging voltages of the two lasers may be measured with high accuracy. The trigger timing may thus be adjusted with high accuracy.

3. Laser System That Controls Trigger Timing Based on Measured Charging Voltage (Second Embodiment)

3.1 Configuration

Figure 12:
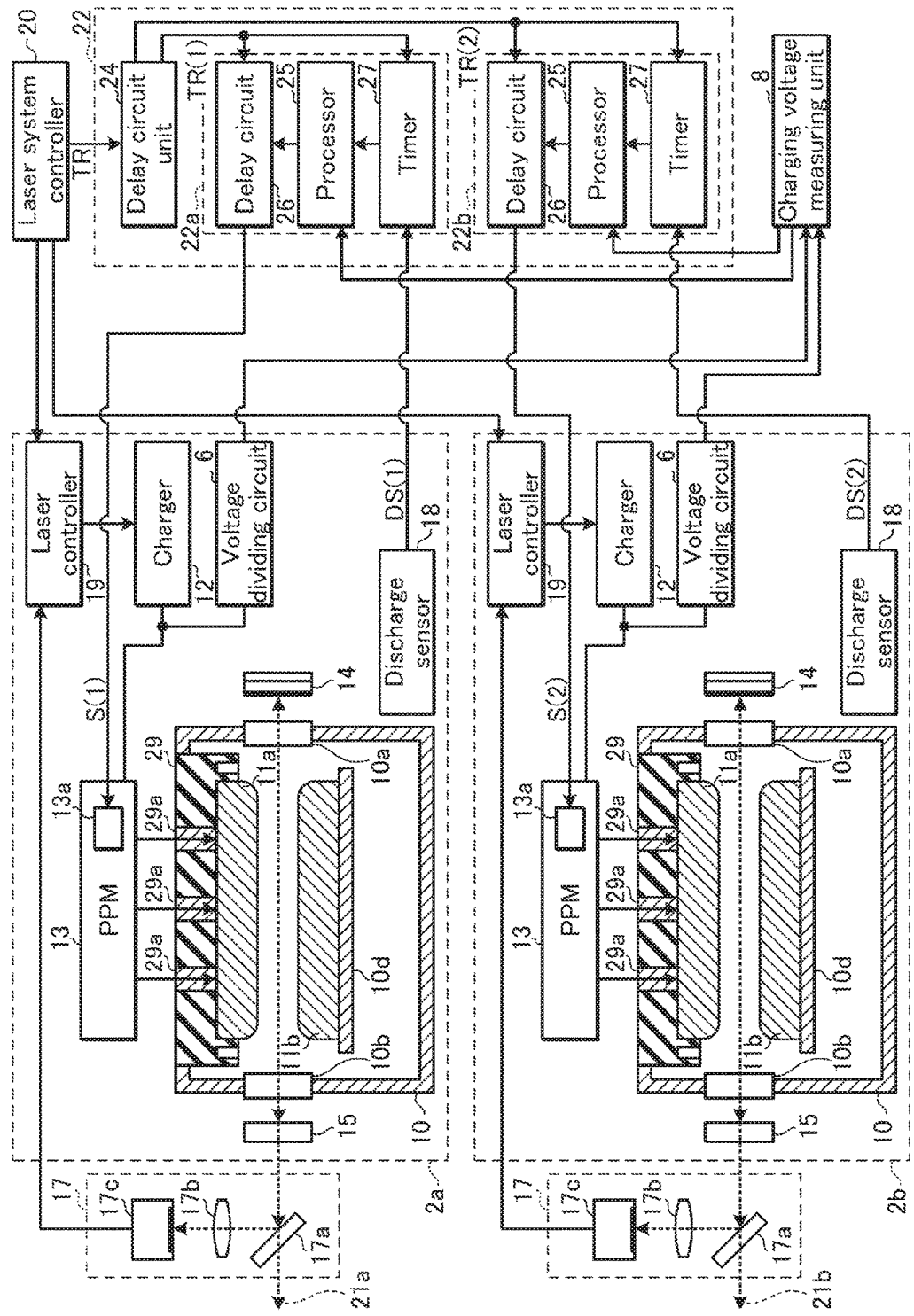
FIG. 12 schematically shows a configuration of a laser system according to a second embodiment of the present disclosure.

FIG. 12 schematically shows a configuration of a laser system according to a second embodiment of the present disclosure. In the second embodiment, each of the first and second laser apparatuses 2a and 2b may not necessarily include the bleeding circuit 7. Further, the laser system 5 may not necessarily include the bleeding circuit controller 9.

The charging voltage measuring unit 8 may be connected to the processor 25 included in the first trigger correction unit 22a and to the processor 25 included in the second trigger correction unit 22b via respective signal lines.

3.2 Operation

The charging voltage measuring unit 8 may send the data on the charging voltage Vm(1) of the storage capacitor C0 of the first laser apparatus 2a to the processor 25 included in the first trigger correction unit 22a.

The charging voltage measuring unit 8 may send the data on the charging voltage Vm(2) of the storage capacitor C0 of the second laser apparatus 2b to the processor 25 included in the second trigger correction unit 22b.

The first and second trigger correction units 22a and 22b may correct the trigger timing of the switching signals S(1) and S(2) based on the charging voltage in the process substantially the same as shown in FIG. 7 described above. However, in the second embodiment, correction of the trigger timing is not performed based on the setting value V(n) of the charging voltage but performed based on the charging voltage Vm(n) of the storage capacitor C0 measured by the charging voltage measuring unit 8.

In other aspects, the second embodiment may be substantially the same as the first embodiment.

According to the second embodiment, the charging voltage measuring unit commonly used for the laser apparatuses may measure the actual charging voltage with high accuracy. Operation of the trigger correction unit based on the actual charging voltage may achieve correction of the trigger timing with high accuracy.

4. Laser System Where Trigger Correction Unit and Laser Apparatus are Integrated (Third Embodiment)

Figure 13:
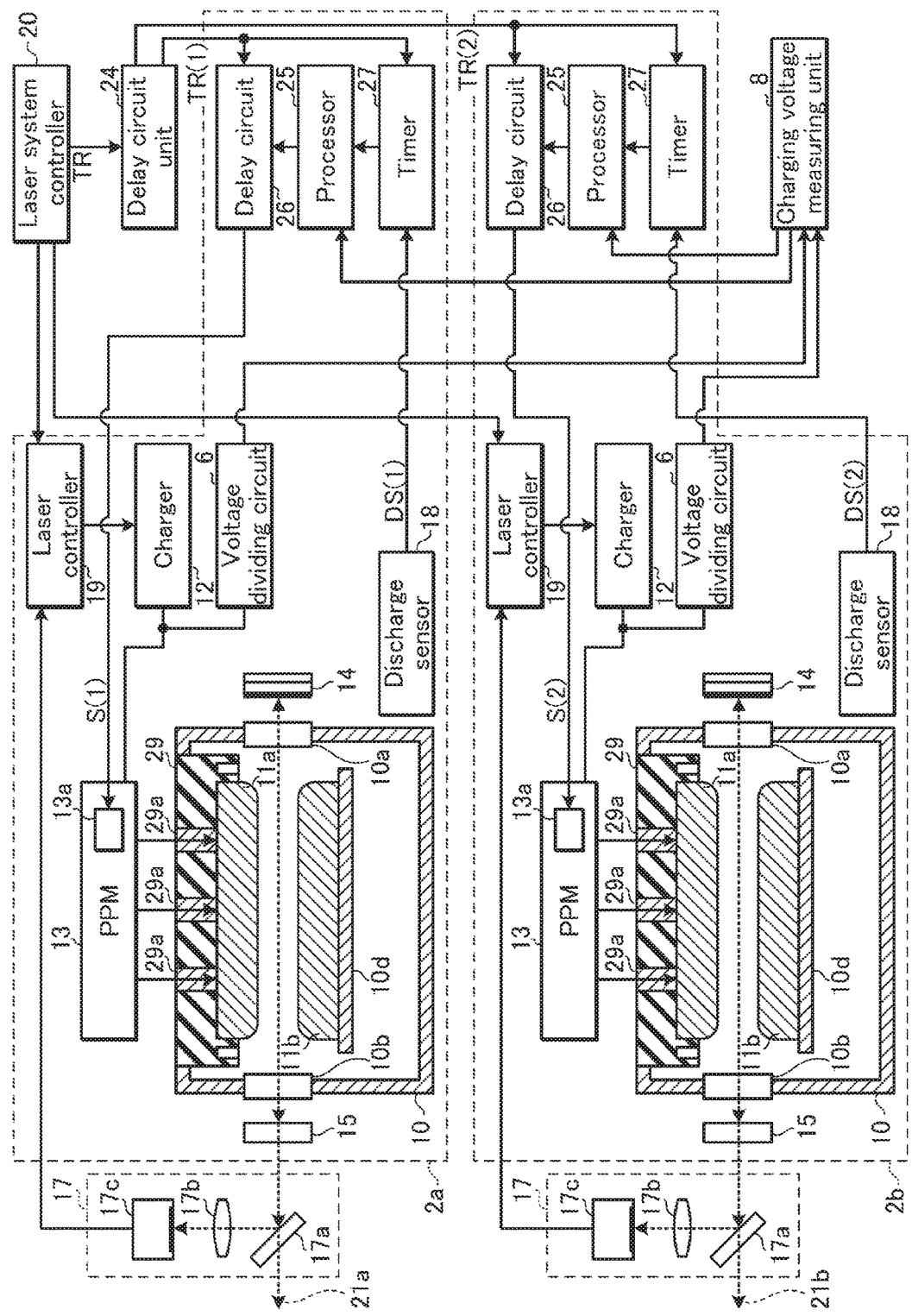
FIG. 13 schematically shows a configuration of a laser system according to a third embodiment of the present disclosure.

FIG. 13 schematically shows a configuration of a laser system according to a third Embodiment of the present disclosure.

In the third embodiment, the first trigger correction unit including the processor 25, the delay circuit 26, and the timer 27 may be integrated with the first laser apparatus 2a. Alternatively, the first trigger correction unit may be included in the first laser apparatus 2a.

In the third embodiment, the second trigger correction unit including the processor 25, the delay circuit 26, and the timer 27 may be integrated with the second laser apparatus 2b.

Alternatively, the second trigger correction unit may be included in the second laser apparatus 2b.

In the third embodiment, an unillustrated clock signal generation unit for the first trigger correction unit and an unillustrated clock signal generation unit for the second trigger correction unit may be separate clock signal generation units. The clock frequency of each clock signal generation unit may preferably be 1 GHz or more.

In other aspects, the third embodiment may be substantially the same as the second embodiment.

In the third embodiment, the laser apparatus not including the bleeding circuit as described in the second embodiment is integrated with the trigger correction unit. However, the present disclosure is not limited to this. The laser apparatus including the bleeding circuit as described in the first embodiment may be integrated with the trigger correction unit.

5. Laser System That Controls Both Bleeding Circuit and Trigger Timing Based on Measured Charging Voltage (Fourth Embodiment)

5.1 Configuration

Figure 14:
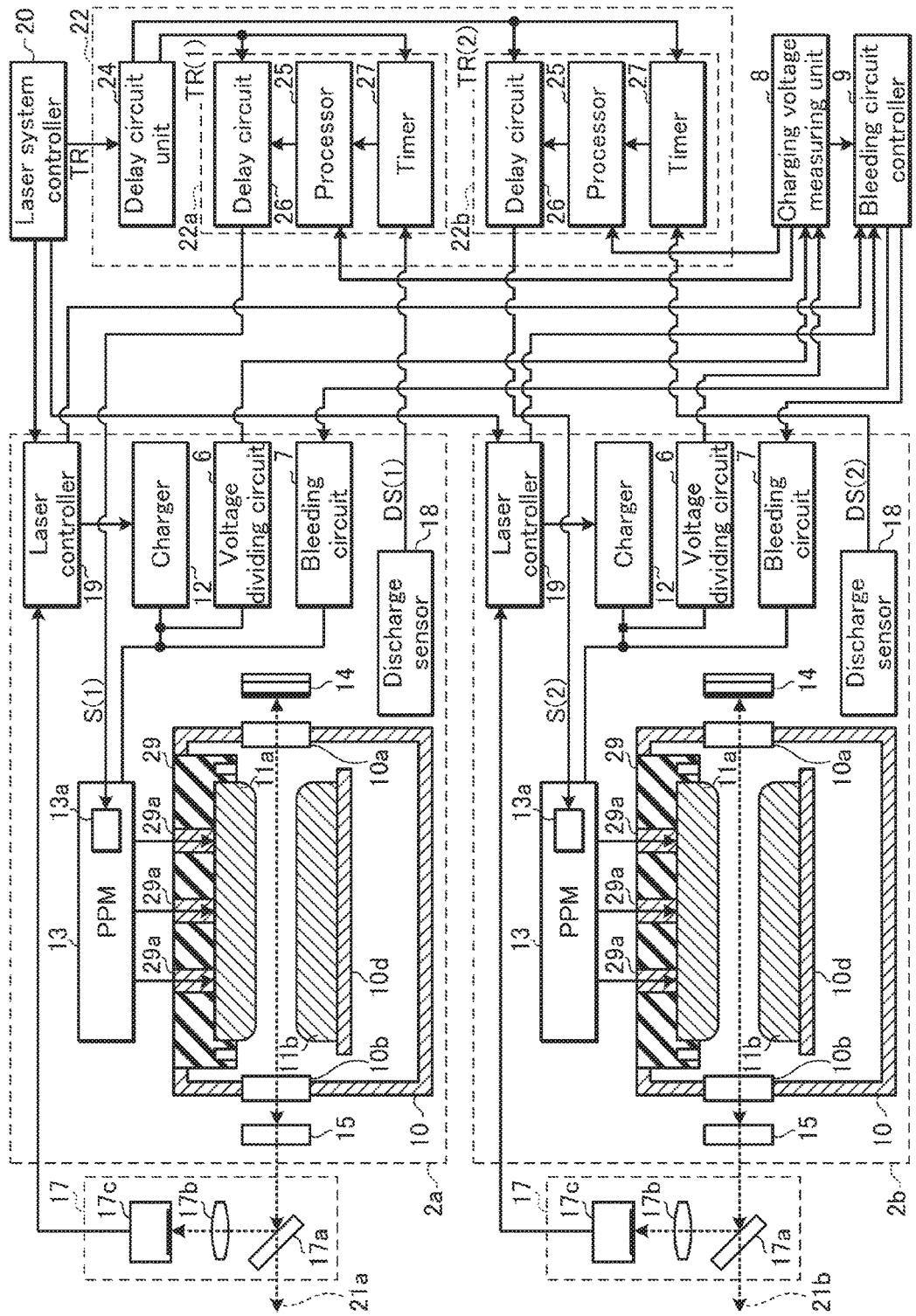
FIG. 14 schematically shows a configuration of a laser system according to a fourth embodiment of the present disclosure.

FIG. 14 schematically shows a configuration of a laser system according to a fourth embodiment oaf the present disclosure. In the fourth embodiment, the charging voltage measuring unit 8 may be connected to the processor 25 included in the first trigger correction unit 22a and the processor 25 included in the second trigger correction unit 22b via respective signal lines.

5.2 operation

The charging voltage measuring unit 8 may send data on the charging voltage Vm(1) of the storage capacitor C0 of the first laser apparatus 2a to both the bleeding circuit controller 9 and the processor 25 included in the first trigger correction unit 22a.

The charging voltage measuring unit 8 may send data on the charging voltage Vm(2) of the storage capacitor C0 of the second laser apparatus 2b to both the bleeding circuit controller 9 and the processor 25 included in the second trigger correction unit 22b.

The bleeding circuit controller 9 may control the charging voltage Vm(n) of the storage capacitor C0 included in each of the first and second laser apparatuses 2a and 2b based on the setting value V(n) of the charging voltage.

The first and second trigger correction units 22a and 22b may correct the trigger timing of the switching signals S(1) and S(2) based on the charging voltage, in the process substantially the same as that in FIG. 7 described above. However, in the fourth embodiment, correction of the trigger timing may be performed not based on the setting value V(n) of the charging voltage, but based on the charging voltage Vm(n) of the storage capacitor C0 measured by the charging voltage measuring unit 8.

In other aspects, the fourth embodiment may be substantially the same as that in the first embodiment.

In the fourth embodiment, the charging voltage measuring unit commonly used for the laser apparatuses may measure the actual charging voltage with high accuracy. Operation of the bleeding circuit based on the actual charging voltage may allow the charging voltage to be adjusted to the setting value with high accuracy. Further, the operation of the trigger correction unit based on the actual charging voltage adjusted around the setting value may allow the trigger timing to be corrected with high accuracy. Stability in the pulse energy of the laser apparatus may thus improve.

6. Laser Apparatuses That Share Bleeding Circuit (Fifth Embodiment)

6.1 Configuration

Figure 15:
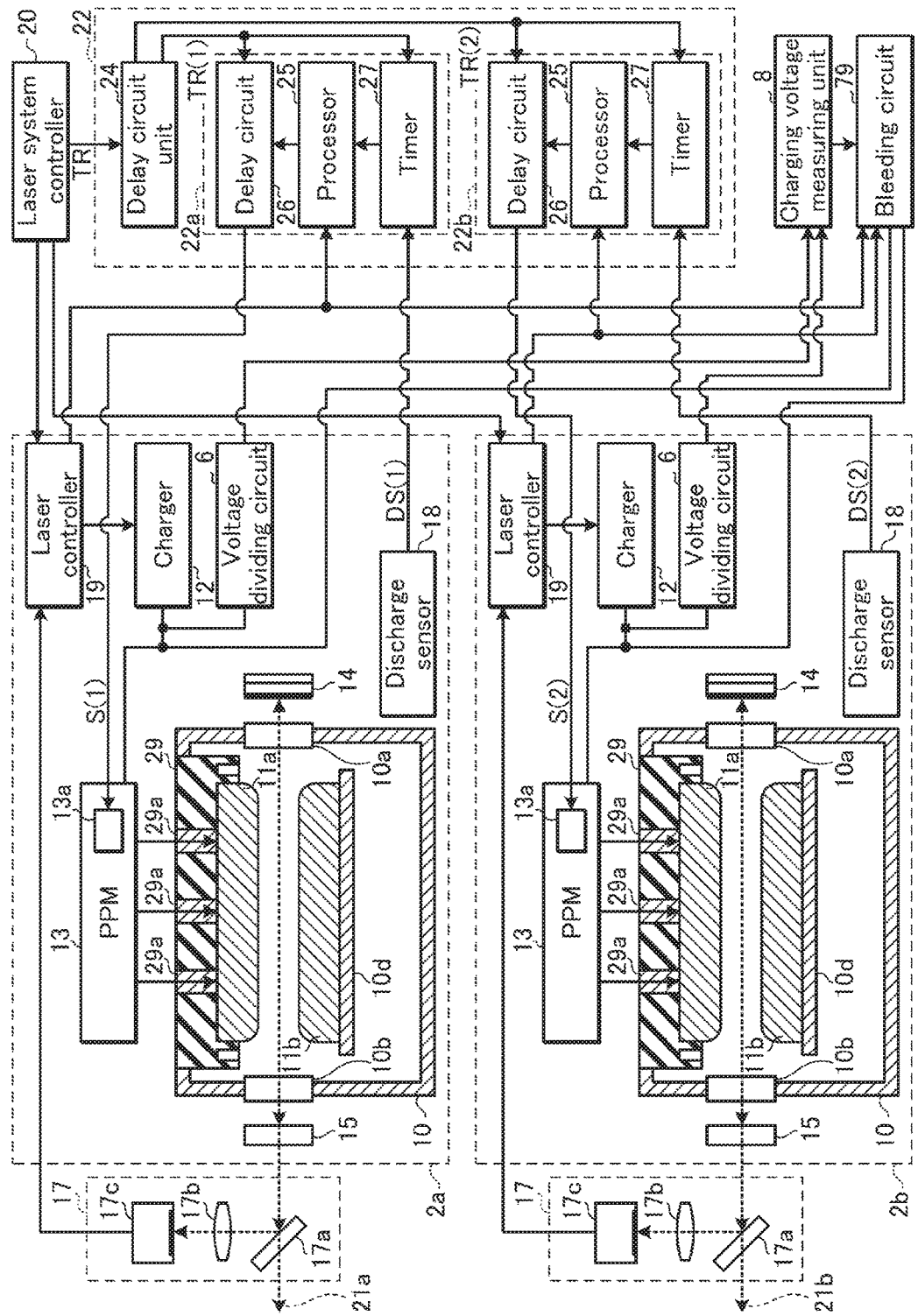
FIG. 15 schematically shows a configuration of a laser system according to a fifth embodiment of the present disclosure.

FIG. 15 schematically shows a configuration of a laser system according to a fifth embodiment of the present disclosure. In the fifth embodiment, the bleeding circuit may not be provided for each of the first and second laser apparatuses 2a and 2b. A single bleeding circuit 79 commonly used for the laser apparatuses may be provided.

Figure 16:
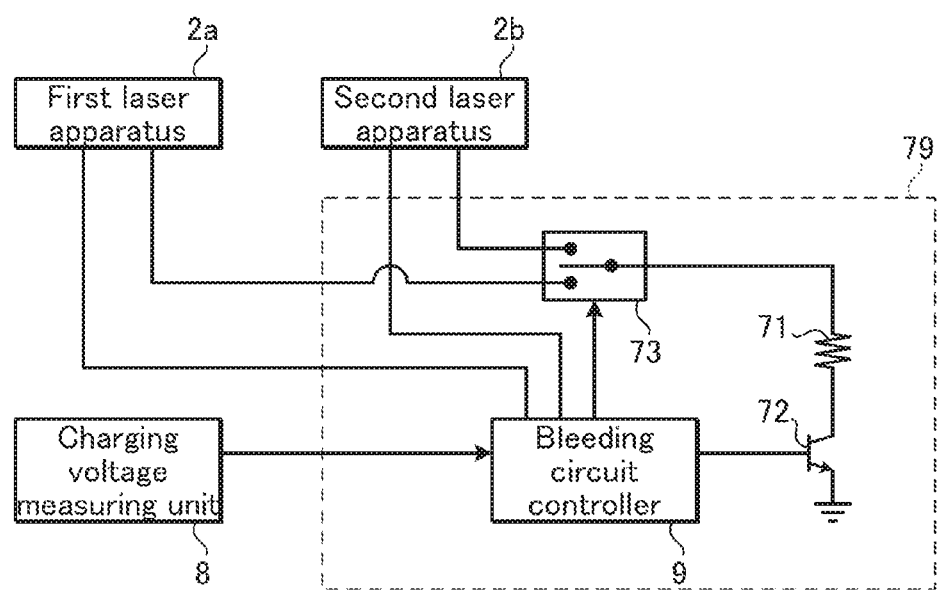
FIG. 16 schematically shows a configuration of a bleeding circuit 79 shown in FIG. 15.

FIG. 16 schematically shows a configuration of the bleeding circuit 79 shown in FIG. 15. The bleeding circuit 79 may include a multiplexer 73, the resistance element 71, the bipolar transistor 72, and the bleeding circuit controller 9. The storage capacitor C0 of the first laser apparatus 2a may be connected to the first channel of the multiplexer 73. The storage capacitor C0 of the second laser apparatus 2b may be connected to the second channel of the multiplexer 73. The multiplexer 73 may further be connected to the resistance element 71. The multiplexer 73 may be a switch capable of switching between a first mode where the storage capacitor C0 of the first laser apparatus 2a is connected to the resistance element 71 and a second mode where the storage capacitor C0 of the second laser apparatus 2b is connected to the resistance element 71.

The bleeding circuit controller 9 may be connected to the laser controller 19 of the first laser apparatus 2a, so as to receive the data on the setting value V(1) of the charging voltage from the laser controller 19.

The bleeding circuit controller 9 may be connected to the user controller 19 of the second laser apparatus 2b, so as to receive the data on the setting value V(2) of the charging voltage from the laser controller 19.

The bleeding circuit controller 9 may further be connected to the charging voltage measuring unit 8, so as to receive the data on the charging voltage measured by the charging voltage measuring unit 8. Namely, the bleeding circuit controller 9 may receive the data on the charging voltage Vm(1) of the storage capacitor C0 of the first laser apparatus 2a, and the data on the charging voltage Vm(2) of the storage capacitor C0 of the second laser apparatus 2b.

The bleeding circuit controller 9 may be connected to the multiplexer 73 via a signal line to control the multiplexer 73.

6.2 Operation

The bleeding circuit controller 9 may control the multiplexer 73 to select the first channel. The storage capacitor C0 of the first laser apparatus 2a may thus be connected to the bipolar transistor 72 via the resistance element 71.

The bleeding circuit controller 9 may compare the setting value V(1) of the charging voltage and the charging voltage Vm(1) of the storage capacitor C0 of the first laser apparatus 2a and may control the bipolar transistor 72 based on the results of the comparison. The bleeding circuit controller 9 may thus adjust the charging voltage of the storage capacitor C0 of the first laser apparatus 2a.

The bleeding circuit controller 9 may control the multiplexer 73 to select the second channel. The storage capacitor C0 of the second laser apparatus 2b may thus be connected to the bipolar transistor 72 via the resistance element 71.

The bleeding circuit controller 9 may compare the setting value V(2) of the charging voltage and the charging voltage Vm(2) of the storage capacitor C0 of the second laser apparatus 2b and may control the bipolar transistor 72 based on the results of the comparison. The bleeding circuit controller 9 may thus adjust the charging voltage of the storage capacitor C0 of the second laser apparatus 2b.

In other aspects, the fifth embodiment may be substantially the same as the first embodiment. Alternatively, a bleeding circuit 79 commonly used for the laser apparatuses may be provided in the fourth embodiment described above with reference to FIG. 14.

According to the fifth embodiment, sharing the bleeding circuit may enable synchronizing control of the trigger timing with a simple configuration.

7. Laser System Including Three or More Laser Apparatuses (Sixth Embodiment)

Figure 17:
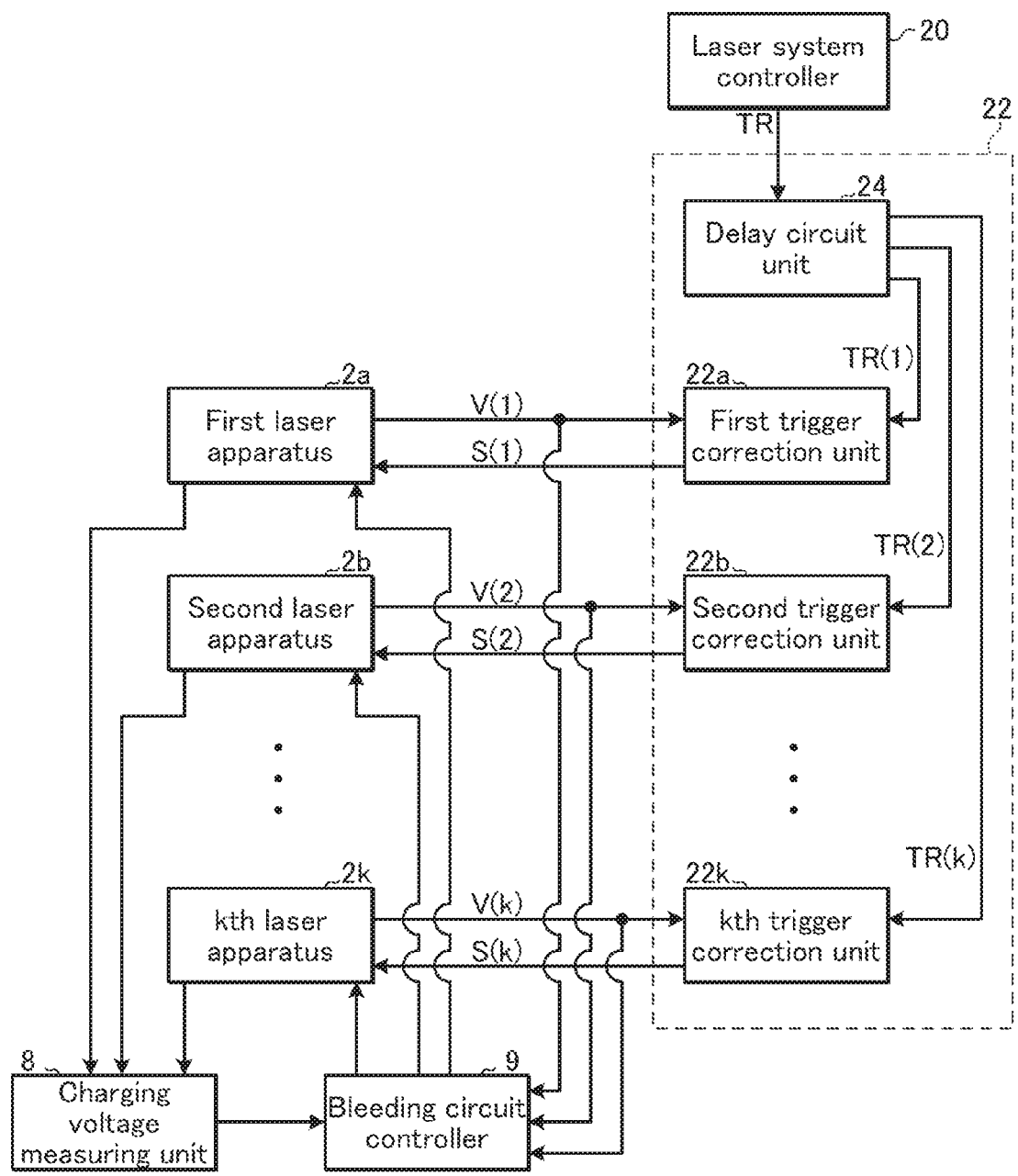
FIG. 17 schematically shows a configuration of a laser system according to a sixth embodiment of the present disclosure.

FIG. 17 schematically shows a configuration of a laser system according to a sixth embodiment of the present disclosure. In the sixth embodiment, three or more laser apparatuses 2a to 2k may be provided. Three or more trigger correction units 22a to 22k for the respective laser apparatuses 2a to 2k may also be provided. The voltage dividing circuit or the bleeding circuit as needed, not shown in FIG. 17, may be provided in each of the laser apparatuses 2a to 2k. The charging voltage measuring unit 8 commonly used for the laser apparatuses 2a to 2k may also be provided.

In other aspects, the sixth embodiment may be substantially the same as any one of the first to fifth Embodiments.

FIG. 1 shows the beam bundling device 3 to bundle the two pulse laser beams outputted from the two laser apparatuses, respectively. In the sixth embodiment, bundling the pulse laser beams outputted from the three or more laser apparatuses 2a to 2k may be achieved, for example, by combining a plurality of bean bundling devices 3.

According to the sixth embodiment, combining multiple laser apparatuses may achieve high pulse energy of the bundled laser beam 21. The laser annealing apparatus 1 may thus irradiate the workpiece P with the bundled laser beam 21 in a predetermined pulse energy density required for annealing and a wide area to be irradiated. Efficient manufacture of large-sized liquid crystal displays may thus be possible.

8. Configuration of Controller

Figure 18:
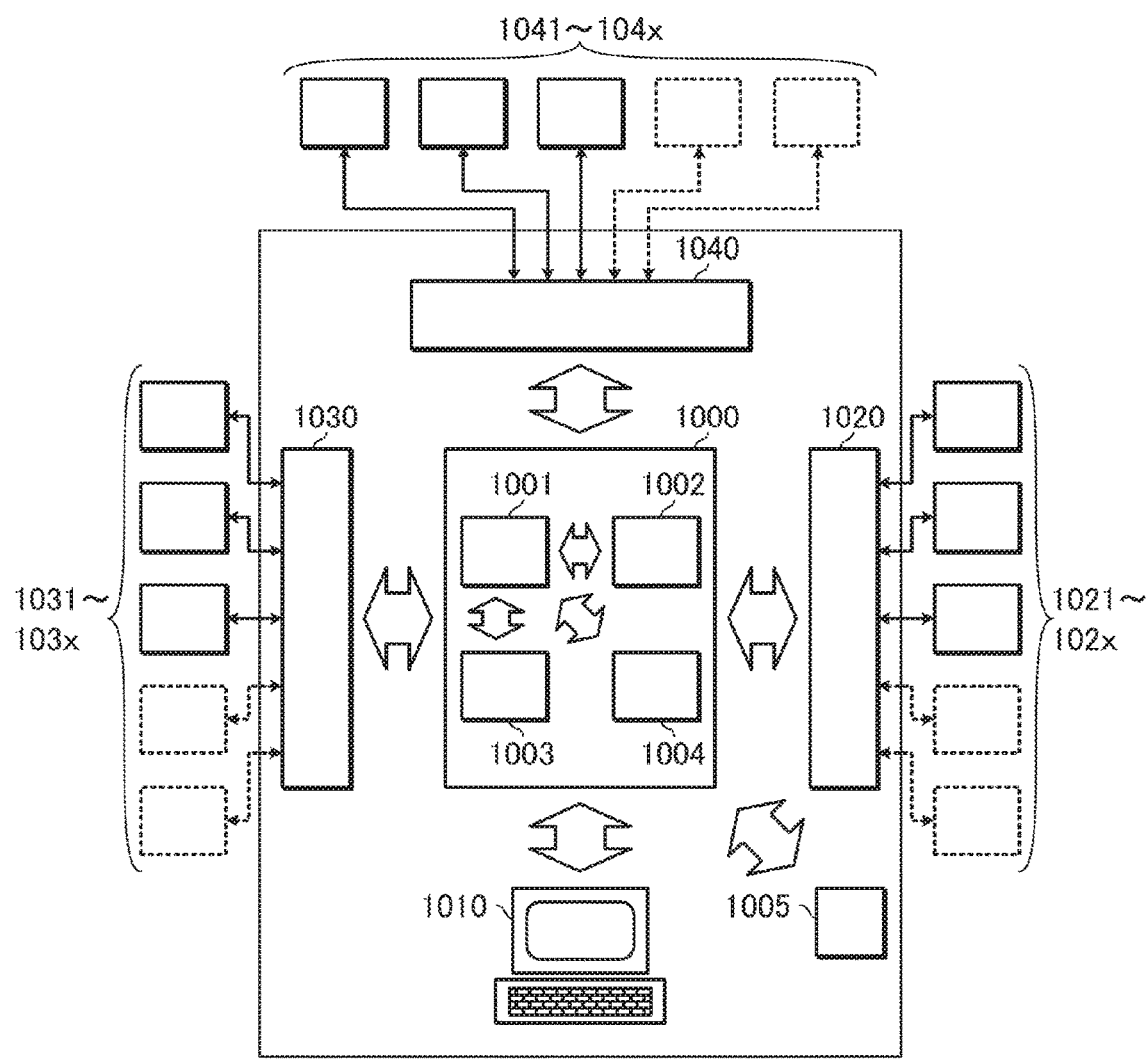
FIG. 18 is a block diagram schematically showing a configuration of a controller.

FIG. 18 is a block diagram schematically showing a configuration of the controller.

Controllers of the above-described Embodiments, such as the laser system controller 20, the synchronizing control unit 22, etc. may be general-purpose control devices, such as computers or programmable controllers. For example, the controllers may be configured as follows.

Configuration

The controllers may each include a processor 1000, and a storage memory 1005, a user interface 1010, a parallel input/output (I/O) controller 1020, a serial I/O controller 1030, and an analog-to-digital (A/D) and digital-to-analog (D/A) converter 1040 which are connected to the processor 1000. The processor 1000 may include a central processing unit (CPU) 1001, a memory 1002, a timer 1003, and a graphics processing unit (GPU) 1004 which are connected to the CPU 1001.

Operation

The processor 1000 may read a program stored in the storage memory 1005, execute the read program, read data from the storage memory 1005 in accordance with the program, or store data in the storage memory 1005.

The parallel I/O controller 1020 may be connected to devices 1021 to 102x with which it may communicate through parallel I/O ports. The parallel I/O controller 1020 may control digital-signal communication through the parallel I/O ports while the processor 1000 executes the program.

The serial I/O controller 1030 may be connected to devices 1031 to 103x with which it may communicate through serial I/O ports. The serial I/O controller 1030 may control digital-signal communication through the serial I/O ports while the processor 1000 executes the program.

The A/D and D/A converter 1040 may be connected to devices 1041 to 104x with which it may communicate through analog ports. The A/D and D/A converter 1040 may control analog-signal communication through the analog ports while the processor 1000 executes the program.

The user interface 1010 may be configured to display the progress of the program being executed by the processor 1000 in accordance with instructions from an operator, or to cause the processor 1000 to stop the execution of the program or perform an interrupt in accordance with instructions from the operator.

The CPU 1001 of the processor 1000 may perform arithmetic processing of the program. The memory 1002 may temporarily store the program being executed by the CPU 1001 or temporarily store data in the arithmetic processing. The timer 1003 may measure time or elapsed time and output it to the CPU 1001 in accordance with the program being executed. When image data is inputted to the processor 1000, the GPU 1004 may process the image data in accordance with the program being executed and output the results to the CPU 1001.

The devices 1021 to 102*x*, which are connected through the parallel I/O ports to the parallel I/O controller 1020, may be used when first and second laser apparatuses 2*a* and 2*b*, the annealing controller 40, or another controller receives or sends the oscillation trigger signal, the timing signal, the data on the charging voltage, the data on the delay time, or the like.

The devices 1031 to 103*x*, which are connected through the serial I/O ports to the serial I/O controller 1030, may be used when the first and second laser apparatuses 2*a* and 2*b*, the annealing controller 40, or another controller sends or receives data that does not require high-speed transmission.

The devices 1041 to 104*x*, which are connected through the analog ports to the A/D and D/A converter 1040, may serve as various sensors, such as the pulse energy measuring unit 17, or the voltage dividing circuit 6.

The controllers thus configured may be capable of realizing the operations described in the embodiments.

The above descriptions are intended to be only illustrative rather than being limiting. Accordingly, it will be clear to those skilled in the art that various changes may be made to the embodiments of the present disclosure without departing from the scope of the appended claims.

The terms used in this specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in this specification and the appended claims should be interpreted as meaning "at least one" or "one or more".

The invention claimed is:

1. A laser system comprising:
    a first laser apparatus including a first laser chamber, a first pair of electrodes provided in the first laser chamber, a first pulse generator including a first storage capacitor, the first pulse generator being configured to generate a pulsed voltage using electric energy stored in the first storage capacitor and configured to apply the pulsed voltage to the first pair of electrodes, and a first charger configured to supply electric energy to charge the first storage capacitor;
    a second laser apparatus including a second laser chamber, a second pair of electrodes provided in the second laser chamber, a second pulse generator including a second storage capacitor, the second pulse generator being configured to generate a pulsed voltage using electric energy stored in the second storage capacitor and configured to apply the pulsed voltage to the second pair of electrodes, and a second charger configured to supply electric energy to charge the second storage capacitor;
    a charging voltage measuring unit configured to be commonly used to measure the charging voltage of the first storage capacitor and the charging voltage of the second storage capacitor;
    at least one bleeding circuit configured to reduce the charging voltage of the storage capacitor and the charging voltage of the second storage capacitor; and
    a bleeding circuit controller configured to control the at least one bleeding circuit based on the voltage measured by the charging voltage measuring unit.

2. The laser system according to claim 1, further comprising:
    a first voltage dividing circuit connected to the first storage capacitor, the first voltage dividing circuit being configured to output voltage divided at a first ratio to the charging voltage of the first storage capacitor to the charging voltage measuring unit; and
    a second voltage dividing circuit connected to the second storage capacitor, the second voltage dividing circuit being configured to output voltage divided at a second ratio to the charging voltage of the second storage capacitor to the charging voltage measuring unit.

3. The laser system according to claim 2, wherein the charging voltage measuring unit includes:
    a switch configured to change between a first mode connected to the first voltage dividing circuit and a second mode connected to the second voltage dividing circuit; and
    a measuring unit connected to the switch, the measuring unit being commonly used to measure the charging voltage of the first storage capacitor and the charging voltage of the second storage capacitor.

4. The laser system according to claim 1, wherein the at least one bleeding circuit includes:
    a first bleeding circuit configured to reduce the charging voltage of the first storage capacitor; and
    a second bleeding circuit configured to reduce the charging voltage of the second storage capacitor.

5. The laser system according to claim 1, wherein the at least one bleeding circuit includes:
    a switch configured to change between a first mode connected to the first storage capacitor and a second mode connected to the second storage capacitor; and
    a bleeding circuit connected to the switch, the bleeding circuit being commonly used to reduce the charging voltage of the first storage capacitor and the charging voltage of the second storage capacitor.

6. The laser system according to claim 1, further comprising
    a third laser apparatus including a third laser chamber, a third pair of electrodes provided in the third laser chamber, a third pulse generator including a third storage capacitor, the third pulse generator being configured to generate a pulsed voltage using electric energy stored in the third storage capacitor and configured to apply the pulsed voltage to the third pair of electrodes, and a third charger configured to supply electric energy to charge the third storage capacitor, wherein
    the charging voltage measuring unit further measures the charging voltage of the third storage capacitor, and the at least one bleeding circuit further reduces the charging voltage of the third storage capacitor.

7. The laser system according to claim 1, further comprising a synchronizing control unit configured to control timing of the pulsed voltage applied by the first pulse generator to the first pair of electrodes, the timing being controlled based of the charging voltage of the first storage capacitor reduced by the at least one bleeding circuit, and timing of the pulsed voltage applied by the second pulse generator to the second pair of electrodes, the timing being controlled based on the charging voltage of the second storage capacitor reduced by the at least one bleeding circuit.

8. A laser system comprising:

a first laser apparatus including a first laser chamber, a first pair of electrodes provided in the first laser chamber, a first pulse generator including a first storage capacitor, the first pulse generator being configured to generate a pulsed voltage using electric energy stored in the first storage capacitor and configured to apply the pulsed voltage to the first pair of electrodes, and a first charger configured to supply electric energy to charge the first storage capacitor;

a second laser apparatus including a second laser chamber, a second pair of electrodes provided in the second laser chamber, a second pulse generator including a second storage capacitor, the second pulse generator being configured to generate a pulsed voltage using electric energy stored in the second storage capacitor and configured to apply the pulsed voltage to the second pair of electrodes, and a second charger configured to supply electric energy to charge the second storage capacitor, a charging voltage measuring unit configured to measure the charging voltage of the first storage capacitor and the charging voltage of the second storage capacitor; and a synchronizing control unit configured to control timing of the pulsed voltage applied by the first pulse generator to the first pair of electrodes, the timing being controlled based on the charging voltage of the first storage capacitor, and timing of the pulsed voltage applied by the second pulse generator to the second pair of electrodes, the timing being controlled based on the charging voltage of the second storage capacitor.

9. The laser system according to claim 8, further comprising:

a first voltage dividing circuit connected to the first storage capacitor, the first voltage dividing circuit being configured to output voltage divided at a first ratio to the charging voltage of the first storage capacitor to the charging voltage measuring unit; and a second voltage dividing circuit connected to the second storage capacitor, the second voltage dividing circuit being configured to output voltage divided at a second ratio to the charging voltage of the second storage capacitor to the charging voltage measuring unit.

10. The laser system according to claim 9, wherein the charging voltage measuring unit includes:

a switch configured to change between a first mode connected to the first voltage dividing circuit and a second mode connected to the second voltage dividing circuit; and a measuring unit connected to the switch, the measuring unit being commonly used to measure the charging voltage of the first storage capacitor and the charging voltage of the second storage capacitor.

11. The laser system according to claim 8, further comprising a third laser apparatus including a third laser chamber, a third pair of electrodes provided in the third laser chamber, a third pulse generator including a third storage capacitor, the third pulse generator being configured to generate a pulsed voltage using electric energy stored in the third storage capacitor and configured to apply the pulsed voltage to the third pair of electrodes, and a third charger configured to supply electric energy to charge the third storage capacitor, wherein the charging voltage measuring unit further measures the charging voltage of the third storage capacitor, and the synchronizing control unit further controls timing of the pulsed voltage applied by the third pulse generator to the third pair of electrodes based on the charging voltage of the third storage capacitor.

* * * * *